(12) United States Patent
Lesso

(10) Patent No.: US 9,515,626 B2
(45) Date of Patent: Dec. 6, 2016

(54) DIGITAL/ANALOGUE CONVERSION

(71) Applicant: Cirrus Logic International Semiconductor Limited, Edinborough (GB)

(72) Inventor: John Paul Lesso, Edinburgh (GB)

(73) Assignee: Cirrus Logic International Semiconductor Ltd., Edinburgh (GB)

( * ) Notice: Subject to any disclaimer, the term of this patent is extended or adjusted under 35 U.S.C. 154(b) by 0 days.

(21) Appl. No.: 14/436,648

(22) PCT Filed: Oct. 10, 2013

(86) PCT No.: PCT/GB2013/052641
§ 371 (c)(1),
(2) Date: Apr. 17, 2015

(87) PCT Pub. No.: WO2014/060723
PCT Pub. Date: Apr. 24, 2014

(65) Prior Publication Data
US 2015/0263686 A1  Sep. 17, 2015

Related U.S. Application Data

(60) Provisional application No. 61/716,030, filed on Oct. 19, 2012.

(30) Foreign Application Priority Data

Oct. 19, 2012  (GB) .................................. 1218794.4

(51) Int. Cl.
*H03M 1/00* (2006.01)
*H03G 3/00* (2006.01)
(Continued)

(52) U.S. Cl.
CPC ........... *H03G 3/001* (2013.01); *H03M 1/0624* (2013.01); *H03M 1/0626* (2013.01); *H03M 1/66* (2013.01); *H03M 1/0863* (2013.01); *H03M 1/70* (2013.01)

(58) Field of Classification Search
CPC .......... H03M 1/70; H03M 1/66; H03M 3/51; H03M 1/46; H03M 1/002; H03M 1/02; H03M 1/0845; H03M 2201/417

USPC ................. 341/118, 120, 139, 140, 142, 144
See application file for complete search history.

(56) References Cited

U.S. PATENT DOCUMENTS 6,353,404 B1 * 3/2002 Kuroiwa ................. H03M 1/70
341/139
(Continued)

FOREIGN PATENT DOCUMENTS

| EP | 1489748 A1 | 12/2004 |
| EP | 1691487 A1 | 8/2006 |
| WO | 2007110556 A1 | 10/2007 |

OTHER PUBLICATIONS

International Search Report and Written Opinion, International Patent Application No. PCT/GB2013/052641, mailed Feb. 14, 2014, 12 pages.
(Continued)

*Primary Examiner* — Linh Nguyen
(74) *Attorney, Agent, or Firm* — Jackson Walker L.L.P.

(57) ABSTRACT

The application relates to digital to analogue conversion circuits having dynamic gain control. A digital variable gain element (102) may apply gain to an input digital signal ($D_{IN}$) upstream of a DAC (101) to make better use of the input range of the DAC and an analogue variable gain element (103) applies a compensating analogue gain. Again controller (201) has a gain allocation module (204) for controlling the allocation of gain between said digital and analogue variable gain elements in response to changes in a signal level of the input digital audio signal. In the present invention the gain allocation module is operable in first and second modes of operation where the response to reductions in signal level is slower in the first mode than in the second mode of operation. A low-level detector (202) monitors the input digital audio signal so as to detect a low-level part of the signal and the gain controller changes from the first mode to the second mode following detection of a low-level part of the input digital audio signal. The response of the gain allocation module in the second mode is preferably fast enough such that the digital gain can be changed to a target setting suitable for the low-level part of the signal before it is received at the digital gain element.

19 Claims, 9 Drawing Sheets

(51) Int. Cl.
  *H03M 1/06* (2006.01)
  *H03M 1/66* (2006.01)
  *H03M 1/08* (2006.01)
  *H03M 1/70* (2006.01)

(56) References Cited

U.S. PATENT DOCUMENTS

| | | | | |
|---|---|---|---|---|
| 2002/0094795 A1* | 7/2002 | Mitzlaff | ................ | H03F 1/0211 |
| | | | | 455/245.1 |
| 2003/0053534 A1* | 3/2003 | Sivadas | ............ | H04L 25/03885 |
| | | | | 375/229 |
| 2011/0234438 A1 | 9/2011 | Daishoji | | |
| 2012/0133411 A1* | 5/2012 | Miao | ...................... | H03G 3/001 |
| | | | | 327/306 |
| 2012/0149423 A1* | 6/2012 | Burdenski | ............ | H03G 3/3042 |
| | | | | 455/522 |
| 2012/0188111 A1* | 7/2012 | Ledzius | .................. | H03M 1/70 |
| | | | | 341/144 |
| 2012/0229208 A1* | 9/2012 | Wimpenny | ........... | H03F 1/0227 |
| | | | | 330/127 |
| 2015/0008962 A1* | 1/2015 | Blyth | .................... | H03F 1/0227 |
| | | | | 327/59 |

OTHER PUBLICATIONS

Search Report under Section 17 and Combined Search and Examination Report under Sections 17 & 18(3), GB Patent Application No. GB1218794.4, dated Feb. 14, 2013, 7 pages.

* cited by examiner

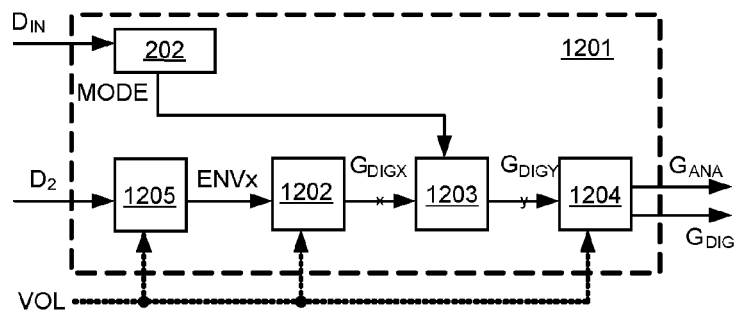
Figure 12
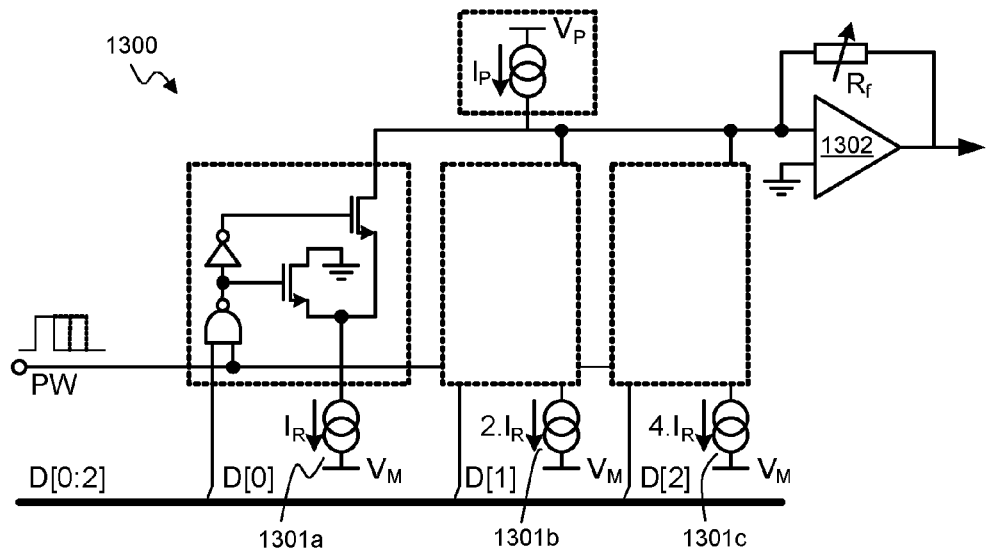
Figure 13
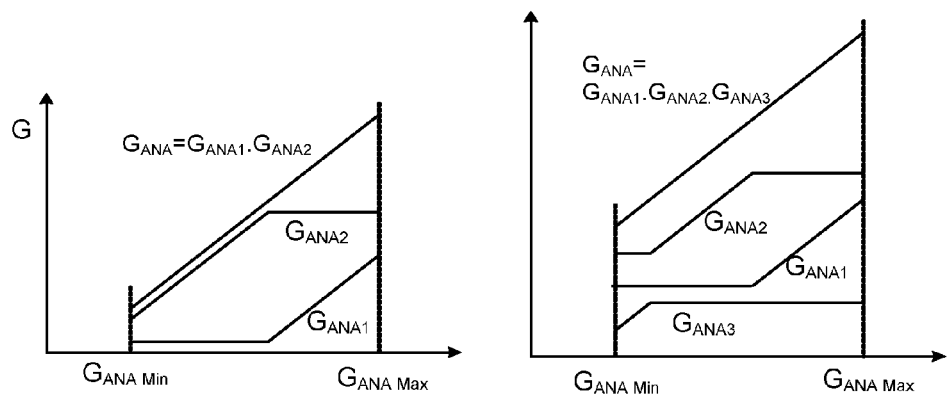
Figure 14a
Figure 14b

DIGITAL/ANALOGUE CONVERSION

This application relates to digital/analogue conversion, especially to a digital-to-analogue conversion circuit having signal related dynamic gain allocation control, particularly for use in audio applications.

Digital-to-analogue converters (DACs) are known and used in a variety of applications. One particular application is in audio signal paths. Increasingly audio data is being stored and transmitted in digital format. The digital audio data may then be converted to an analogue data signal, for instance for driving an audio output transducer such as a loudspeaker (e.g. a headphone/earphone speaker) or to be provided as an analogue line-out signal. A DAC may therefore be arranged in such an audio signal path to convert the digital data into a suitable analogue format which may then be amplified to provide the driving/output signal.

In such applications, to maximise the effective resolution of the DAC, it is known to apply a signal-dependent digital gain to the input digital signal prior to conversion and apply a corresponding inverse gain adjustment to the analogue signal to compensate for the digital gain change. Typically a small amplitude digital input signal may be amplified so as to make use of more of the DAC input range, thus effectively improving the resolution of the DAC for small amplitude signals. A corresponding attenuation is applied to the analogue signal to compensate for the digital amplification. This means that, for small signals, the quantisation noise of the DAC, and also thermal noise upstream of the analogue gain element, may be attenuated by the low analogue gain.

The pre- and post-conversion scaling gains applied may thus vary in line with the amplitude of input digital signal. Typically the gains to be applied are based on some sort of signal amplitude level detection, for instance peak detection. FIG. 1 illustrates the basic arrangement of a known DAC circuit having dynamic gain control based on the input signal. FIG. 1 shows a signal path for receiving an input digital signal, $D_{IN}$, and outputting a corresponding analogue output signal $A_{OUT}$. The digital input signal may, for example, be received from upstream digital processing circuitry or from a memory etc. The signal path includes a DAC 101 for performing the digital-to-analogue conversion. Before the DAC 101 in the signal path is a digital variable gain module 102, which in this example is a digital multiplier. Downstream of the DAC 101 in the signal path is an analogue gain element 103, which in this example is an amplifier such as an audio amplifier that may be used to drive a headphone output, i.e. to produce an analogue output signal $A_{OUT}$ suitable for driving a headphone loudspeaker for example.

The input digital signal $D_{IN}$ is received by gain allocation module 104 which includes an envelope detector 105 and gain select module 106. Envelope detector 105 determines the signal envelope level ENV of the input signal $D_{IN}$ and provides an envelope value to gain select module 106 which determines appropriate pre- and post scaling gain factors to be applied. A control signal $G_{DIG}$ is provided to digital gain module 102 which applies a corresponding gain adjustment to the digital signal to provide gain adjusted digital signal $D_G$. Where the input digital signal $D_{IN}$ has a relatively small envelope level the digital signal $D_G$ may be amplified compared to $D_{IN}$ so as to make use of more of the input range of DAC 101.

The digital signal $D_G$ output from gain module 102 is input to DAC 101 and converted to an analogue signal $A_1$. This analogue signal is received by analogue gain element 103. The analogue gain element 103 is controlled by control signal $G_{ANA}$ from gain select module 106 to compensate for the digital gain applied. Thus the analogue gain may be an attenuation which effectively applies an inverse gain to that applied in digital gain module 102.

In some applications the allocation of the total gain between analogue and digital gain factors may also be adjusted in response to a control signal such as a volume control signal for example. For instance gain factors of G and VOL/G may be applied to modules 102 and 103 respectively, to apply a certain overall gain equal or related to the control signal VOL.

It will be appreciated that, to avoid any glitches in the output, any changes to the digital gain introduced at a point in the digital signal should ideally be compensated exactly with corresponding changes in the analogue gain introduced at the corresponding point in the analogue signal. However there are various practical issues which may result in undesirable effects. For example the timing of the gain changes may not be accurately synchronised due, for example, to: unpredictable or varying propagation delays of digital signals; or the transient response of a finite-bandwidth op-amp-based gain stage while it settles to a change in feedback factor. There are also practical issues in terms of achieving the correct level of gain. Whilst the pre-scaling of the signal is digital, and thus can be accurately controlled, the post-scaling is analogue so there may be some analogue gain errors, due to causes such as resistor mismatch or the like. There are also practical issues associated with offsets. The analogue gain element 103 may suffer from offset errors that may change with analogue gain setting. For example the DAC output may be referenced to mid-supply, whereas the headphone amplifier 103 may deliver a ground-referenced output, relying on the common-mode rejection of the amplifier circuit: the common-mode rejection of this type of circuit may depend on mismatch of currently selected resistors, and thus be gain-dependent, in turn giving a gain-dependent offset voltage. Thus as the gain factors applied change as a result of the signal envelope changing there may be step changes in the offset observed at the output which may result in artefacts in the output signal which, for an audio application, could result in potentially audible artefacts.

Embodiments of the present invention aim to at least mitigate these problems.

Thus according to the present invention there is provided a digital to analogue conversion circuit comprising:
    a digital input for receiving an input digital audio signal;
    an analogue output for outputting an analogue version of the input digital audio signal;
    a digital-to-analogue converter located in a signal path between the digital input and analogue output and having a DAC input;
    a digital variable gain element configured to apply a digital gain in a segment of said signal path between the digital input and the DAC input;
    an analogue variable gain element configured to apply an analogue gain in a segment of said signal path between the DAC input and the analogue output; and
    a gain controller comprising:
        a gain allocation module configured to control the allocation of gain between said digital and analogue variable gain elements in response to changes in a signal level of the input digital audio signal;
        wherein said gain allocation module is operable in first and second modes of operation wherein the response of the gain allocation module to reductions in said signal level of the input digital signal is slower in the first mode than in the second mode of operation; and a low-level detector configured to monitor the input digital audio signal at the digital input so as to detect a low-level part of the signal;

wherein the gain controller is configured to change said gain allocation module from said first mode of operation to said second mode of operation following detection by said low-level detector of a low-level part of the input digital audio signal.

The segment of the signal path between said digital input and said digital variable gain element may have a propagation delay that is equal to a first time period; and the gain controller may have a propagation delay between arrival of a low-level part of the signal at the digital input and the corresponding change in operating mode of the gain allocation module that is equal to a second time period. The first time period is greater than the second time period by an amount equal to a third time period.

In the second mode of operation, the response of the gain allocation module to reductions in signal level is advantageously fast enough such that the minimum time taken to change from an initial digital gain allocation existing on the change to the second mode of operation to a target digital gain allocation appropriate for the low-level part of the signal is less than the third time period for substantially all possible initial digital gain allocations. In the first mode the response of the gain allocation module to reductions in signal level may be such that the minimum time between a change in signal level being detected by the gain allocation module and a corresponding change in gain is greater than the third time period.

In the first mode, the response of the gain allocation module to reductions in signal level may be such that the minimum time required for the gain of the digital variable gain element to change from a first digital gain allocation to a second digital gain allocation is greater than the third time period. In other words there is at least one amount of gain change that could not be implemented in a time equal to the first time period. In the second mode, the response of the gain allocation module to reductions in signal level may be such that the minimum time required for the gain of the digital variable gain element to change from the first digital gain allocation to the second digital gain allocation is shorter than the third time period. In the first mode, the minimum time required for the gain of the digital variable gain element to change from the first digital gain allocation to the second digital gain allocation may be greater than the first time period. The first digital gain allocation may be at or near the minimum digital gain allocation and/or the second digital gain allocation is at or near the maximum digital gain allocation.

The gain controller is thus preferably configured to change from the first mode of operation to the second mode of operation whilst the gain allocation module is controlling the allocation of gain between said digital and analogue variable gain elements in response to changes in signal level in a part of the signal which precedes the low-level part of the signal.

The gain allocation module may comprise an envelope detector for monitoring the envelope level of the digital input audio signal and the gain allocation module controls the digital gain allocation in response to said detected envelope level. In some embodiments the envelope detector monitors a delayed signal which is a version of the digital input audio signal which is delayed with respect to the digital input audio signal at the digital input by a first delay period. The first delay period may be greater than the propagation delay between arrival of a low-level part of the signal at the digital input and the corresponding change in operating mode of the gain allocation module. The envelope detector may monitor a version of the digital input audio signal at a first point in the signal path downstream of the digital input. The signal path may comprise at least one delay element between the digital input and the first point in the signal path downstream of the digital input, which may comprise an filter, such as an interpolation filter. The signal path may have a propagation delay between the digital input and the first point which is substantially equal to the first delay period. Additionally or alternatively the gain allocation module may comprise a delay element arranged to delay the signal input to the envelope detector.

The envelope detector may have a variable decay time constant which is reduced in the second mode compared to the first mode. In the second mode the decay time constant may be reduced progressively. Additionally or alternatively the envelope detector may have a variable hold time which is reduced in the second mode compared to the first mode.

In some embodiments the response of the envelope detector to signal reductions is sufficiently fast for the second mode of operation, and the gain allocation module comprises gain selection circuitry configured to, in the first mode of operation, limit the change in gain allocation in response to the detected envelope to provide the slower response of the gain allocation module. The output from the envelope detector may be delayed before being received by said gain selection circuitry. The gain selection circuitry may apply smoothing or filtering to the detected envelope in the first mode of operation prior to determining the gain allocation. The gain selection circuitry may comprise a first gain calculation module for determining a first gain control signal based on said detected envelope and a second gain calculation module for, in the first mode, delaying or filtering said first gain control signal, and a third gain calculation module for determining the gain allocation based on the output of the second gain calculation module.

The gain controller may comprise a filter for filtering the signal from the signal path before envelope detection, which may comprise a filter element for emphasising any rise in signal level. Such filter element may comprise a splitter for splitting the input signal into two paths and a summer for adding the signals of the two paths together, wherein one path comprises a differentiator. The filter element may be arranged as pre-filter to at least one of: a low-pass filter, a high-pass filter and a band-pass filter.

The envelope detector may act on the digital input audio signal and the low-level detector may act on the output of said envelope detector.

The low-level detector may detect a low-level part of the signal if the digital signal is at or below a first threshold. In some instances a low-level part of the signal is only detected if the digital signal remains below the first threshold for a predetermined period of time. The low-level detector may comprise at least one comparator for comparing the digital input signal with the first threshold and a timer circuit responsive to said comparator to determine when the digital signal remains at or below the first threshold for a predetermined period of time.

In some embodiments the digital to analogue converter comprises the analogue variable gain element. The analogue output from the digital to analogue converter may therefore include any analogue gain adjustment controlled by the gain controller. The analogue variable gain element may comprise a programmable resistor of an amplifier of the digital to analogue converter. In some instances the digital to analogue converter comprises an array of selectable weighted current sources and the analogue variable gain element comprises a duty cycle modulator for modulating the current duty cycle said plurality of current sources.

The gain controller may be responsive to a volume control signal to adjust said gain allocation to provide a volume controlled gain.

The digital-to-analogue conversion circuit may be formed as an integrated circuit and/or may be used in an audio circuit such as: an audio codec, an audio hub, an audio amplifier circuit; an active noise cancellation circuit; or an audio driver circuit. Embodiments of the invention also relate to an electronic device comprising such a digital-to-analogue conversion circuit, which may be at least one of: a portable device; a battery powered device; a communications device; a computing device; a laptop computer, a tablet, a mobile telephone; a personal media player; a PDA; or a games device.

The invention also provides a method of controlling the allocation of gain between digital and analogue variable gain elements in a signal path comprising a digital-to-analogue converter, the method comprising:
controlling said allocation in response to changes in a signal level of the input digital audio signal;
monitoring an input digital audio signal at a digital input to the signal path so as to detect a low-level part of the signal; and
in the event that a low-level part of the signal is detected, changing said gain allocation module from a first mode of operation to a second mode of operation wherein the response of the gain allocation module to reductions in said signal level of the input digital signal is slower in the first mode than in the second mode of operation.

In another aspect of the invention there is provided a digital to analogue conversion circuit comprising: a digital input for receiving an input digital audio signal; an analogue output for outputting an analogue version of the input digital signal; a digital-to-analogue converter located in a signal path between the digital input and analogue output and having a DAC input; a digital variable gain element configured to apply a digital gain between the digital input and the DAC input; an analogue variable gain element configured to apply an analogue gain between the DAC input and the analogue output; and a gain controller configured to control the gain of said digital variable gain element and said analogue variable gain element in response to changes in the signal level of the received digital signal; wherein the gain controller is configured to monitor the digital signal level at said digital input so as to detect a quiet part of the signal corresponding substantially to silence; and on detection of such a quiet part of the signal, the response time of the gain controller to reductions of the signal level is reduced before the quiet part of the signal reaches the digital variable gain element.

In a further aspect there is provided a digital to analogue conversion circuit comprising: a signal path for receiving a digital signal and outputting an analogue signal; a digital-to-analogue converter located in said signal path; a first variable gain element for applying a controlled gain to the digital signal prior to the digital-to-analogue converter; a second variable gain element for applying a controlled gain to the analogue signal produced by said digital-to-analogue converter; gain controller comprising configured to control the allocation of gain between said first and second variable gain elements in response to changes in a signal level of the digital signal, wherein said gain controller monitors the input digital signal at the digital input so as to detect a low-level part of the signal; wherein on detection of said low-level part of the signal the gain controller changes from a first mode of operation to a second mode of operation at a time which is before the low-level part of the signal is received at the first variable gain element by a first time period; and wherein in the second mode of operation a greater amount of change in gain allocation can be implemented in a period equal to said first time period than in the first mode of operation.

In a further aspect there is provided a digital-to-analogue conversion circuit comprising: an audio signal path for receiving a digital audio signal and outputting an analogue audio signal; a digital-to-analogue converter disposed within said audio signal path; digital variable gain circuitry disposed within said audio signal path; analogue variable gain circuitry disposed within said audio signal path; a gain allocation module for controlling the allocation of the respective gains of the digital and analogue gain circuitry in response to the digital audio signal; and level detect circuitry for detecting the level of a digital audio signal at a first point along said signal path wherein the level control circuitry controls the maximum rate of change of gain of the gain controller in response to the level of said digital audio signal at said first point.

In general aspects of the invention provide a digital-to-analogue conversion circuit comprising: a dynamic gain allocation controller for allocating gain inversely between digital input and analogue output gain elements; and a low-level detector circuit for detecting low-level portions of a received digital audio input signal; said gain allocation controller being responsive to said low-level detector to switch into a fast-response mode on detection of said low-level portion. The gain allocation controller and low-level detector are preferably configured with respect to a propagation delay in the signal path such that, on switching to the fast-response mode, the digital gain is increased to a value appropriate for the low-level signal portion amplitude before arrival of said low-level portion at the digital gain element.

In a further aspect there is provided a conversion circuit comprising: a dynamic gain allocation controller for allocating gain inversely between digital and analogue gain elements in an audio signal path; and a detector for detecting the level of a received digital audio signal; wherein said detector controls the response of said controller in accordance with the level of said digital audio signal.

The invention will now be described by way of example only, with reference to the accompanying drawings, of which:

Figure 3:
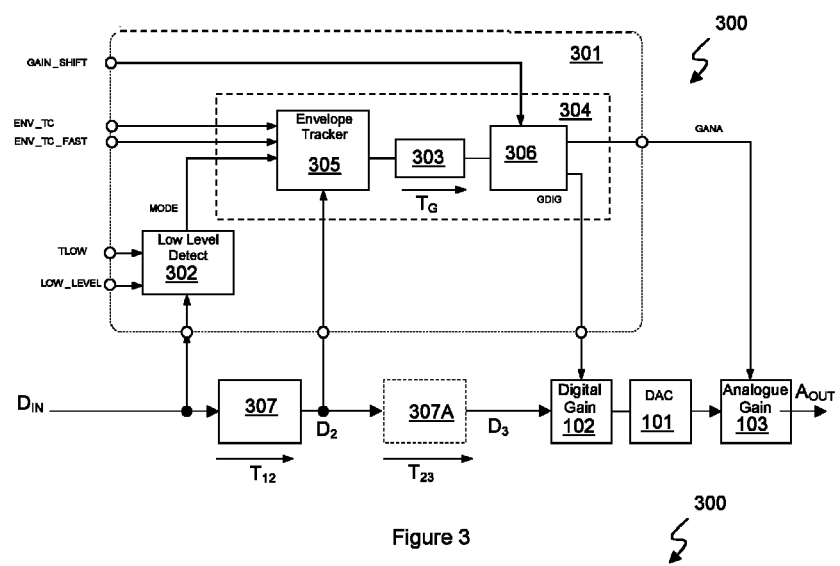
FIG. 3 illustrates a further digital-to-analogue conversion circuit according to the present invention.
Figure 6:
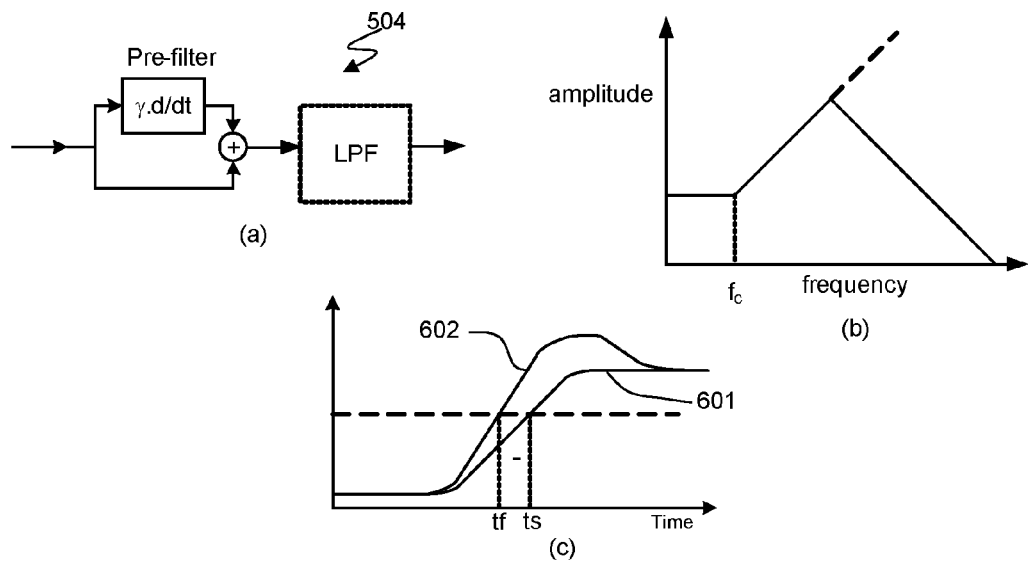
Figure 7:
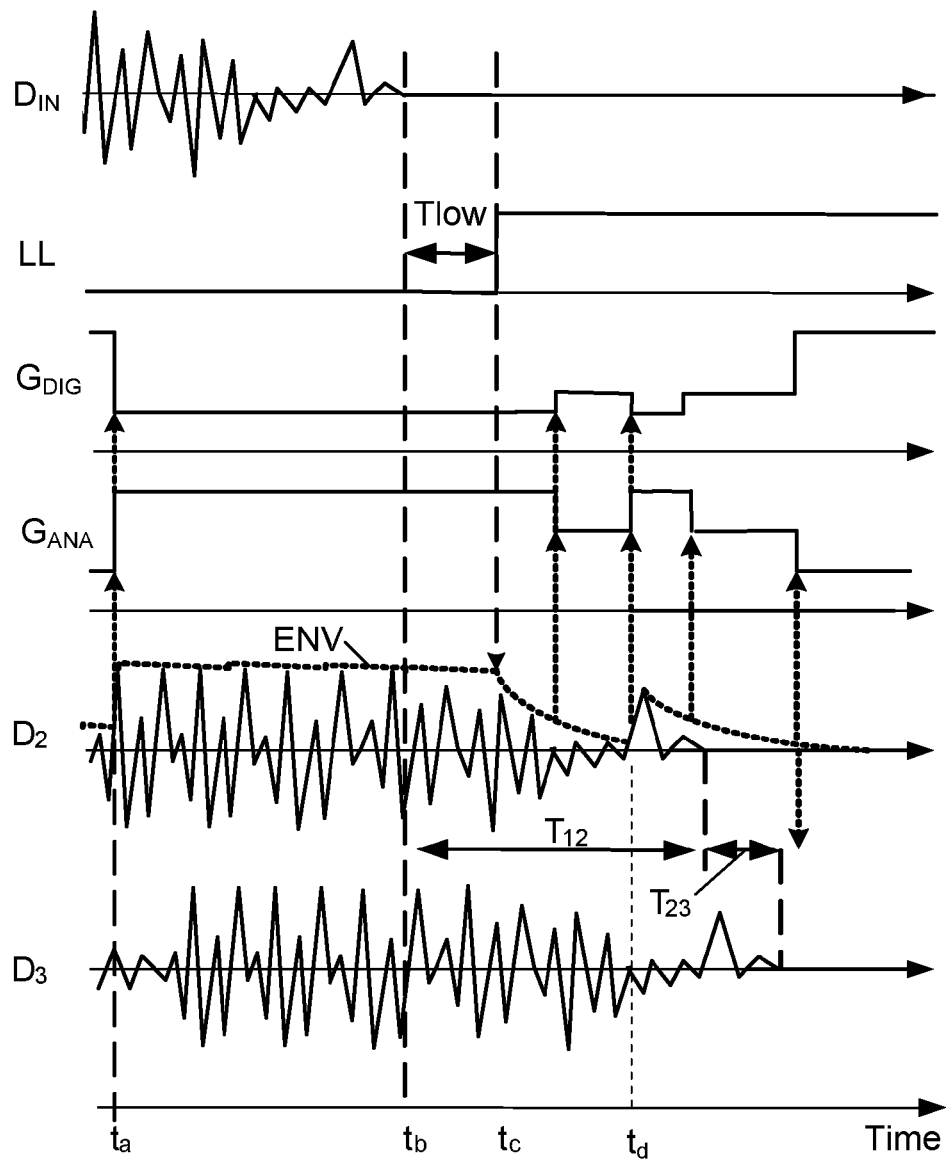
Figure 8:
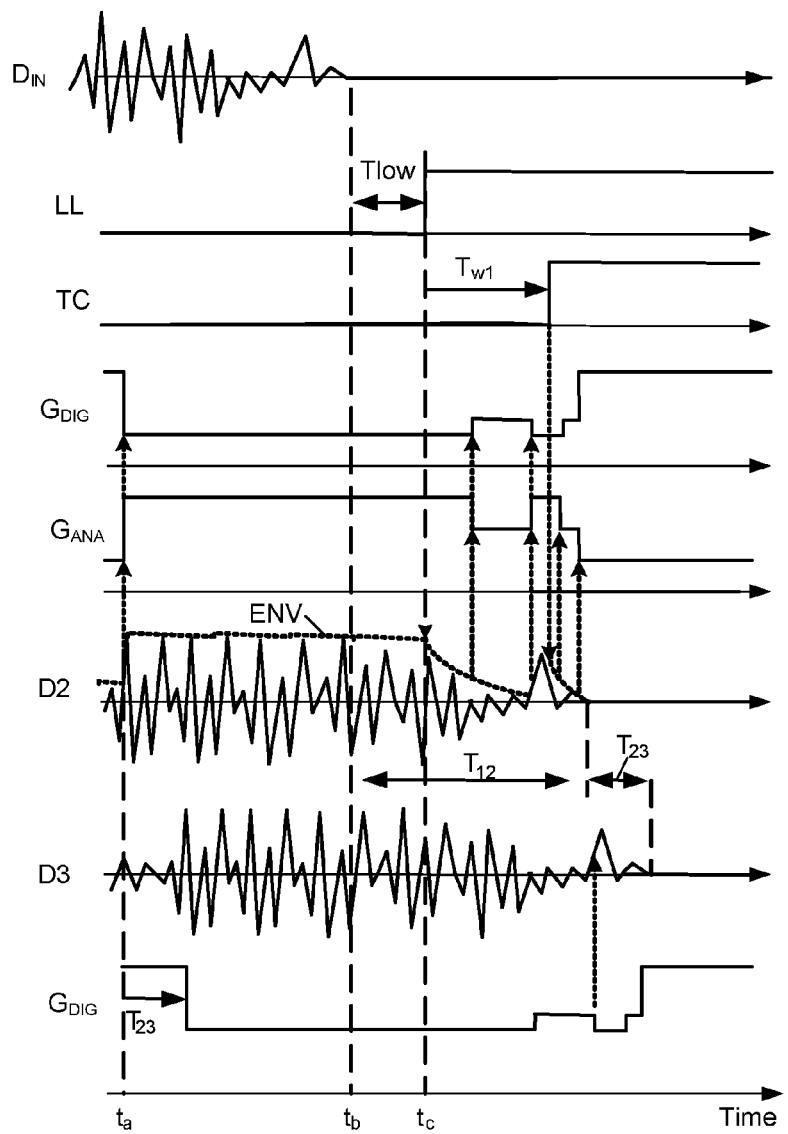
Figure 9:
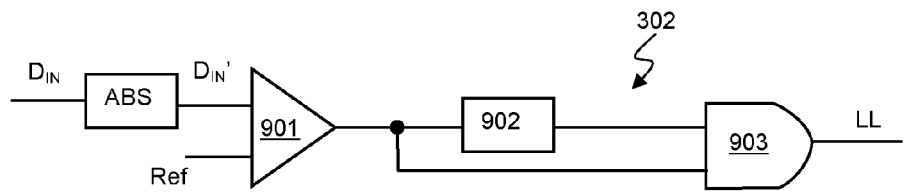
Figure 10A:
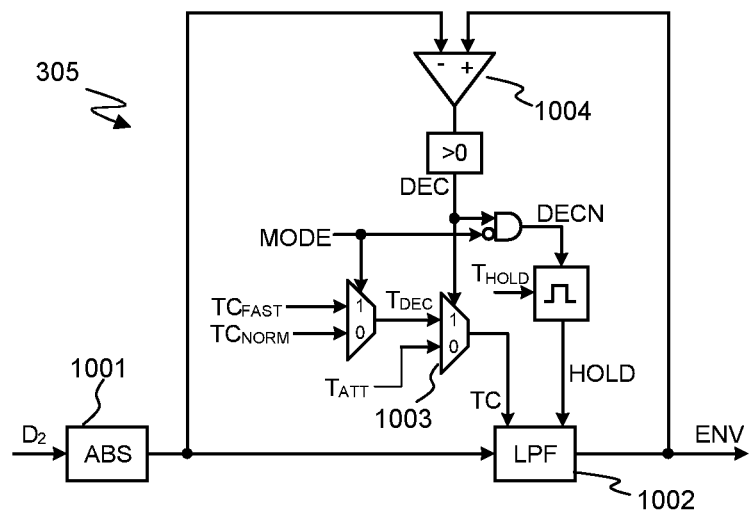
Figure 11:
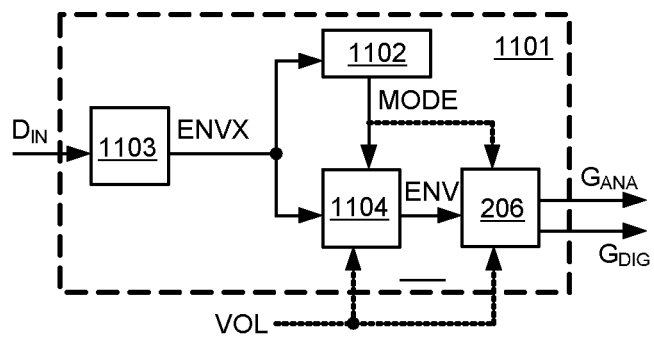
Figure 15:
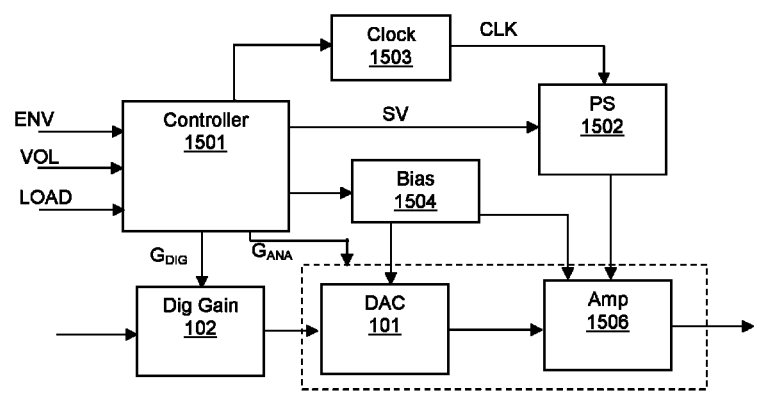

FIGS. 6a-c illustrate a suitable filter arrangement for filtering the input signal to an envelope detector and the resulting performance;

FIG. 7 illustrates another example of various signal waveforms at various parts of the circuit shown in FIG. 3;

FIG. 8 illustrates the various signals arising from the same input signal as shown in FIG. 7 in a circuit according to another embodiment of the invention;

FIG. 9 illustrates an example of a low-level detector;

FIGS. 10*a* and *b* illustrate an example of a suitable envelope detector;

FIG. 11 illustrates a gain controller according to further embodiment of the invention;

FIG. 12 illustrates a gain controller according to a yet further embodiment of the invention;

FIG. 13 illustrates a combined DAC and analogue gain element;

FIGS. 14*a* and *b* illustrate how the various gain factors may be modulated in a DAC such as shown in FIG. 13; and FIG. 15 illustrates an example audio circuit.

As described above with relation to FIG. 1 it is known to pre-scale a digital signal, $D_{IN}$ by a signal dependent scaling factor before digital-to-analogue conversion so that the scaled signal $D_G$ makes use of substantially all of the input range of the digital-to-analogue converter (DAC) 104. The resulting analogue signal $A_1$ can then be scaled, post conversion, to compensate for the digital gain.

As noted however there may be various sources of possible error in matching a change in digital gain with the corresponding change in analogue gain. For instance the timing of the relevant gain changes needs to be accurately synchronised for these to be introduced at the equivalent parts of the digital and analogue signals otherwise there may be step changes in the amplitude of the analogue output signal due to changes in gain mismatched in time. Additionally there could be discrepancies between the nominal and actual analogue gain factors applied, e.g. due to manufacturing tolerances, which may vary depending on the nominal gain factor. Further there could be gain-dependent offsets in the analogue gain circuitry.

For example the analogue gain element could comprise an inverting op amp circuit which amplifies the DAC output by a gain of $(-R_f/R_i)$, where $R_f$ is the value of a feedback resistance and $R_i$ is the value of an input resistance. The values of $R_f$ and/or $R_i$ may be digitally programmed, for instance using a network where $R_i$ and $R_f$ are various combinations of series resistors, to achieve the desired gain. In practice the op amp will have an offset voltage. The DAC output signal may also have a D.C. offset, possibly due to the input offset of an op amp inside the DAC or mismatch of elements of the DAC. The output voltage Vout of the op amp will thus include at least two components of offset voltage, both of which vary (differently) with $R_i$ and $R_f$. The total output offset will thus vary with $R_f$ and Ri, i.e. with the programmed gain.

Any of these errors could lead to a signal glitch when the gain factor is changed.

To reduce any signal-dependent distortion artefacts arising due to said gain adjustments the gain allocation module has a relatively slow response to reductions in the signal level. The speed of response of the gain allocation module to increases and decreases in the signal level may be determined by the respective attack and decay time constants of the envelope detector 105. The envelope detector 105 typically has a relatively fast attack time constant, so that any increases in the envelope of the input signal are detected quickly. This ensures that the digital gain can be reduced quickly when required so that the input digital signal is not amplified to a level which is greater than the input range of the DAC. To provide the slow response to signal reductions however the envelope detector 105 has a relatively slow decay time constant, for instance a decay time constant of the order of 300 ms or so, so that the output value from the envelope detector 105 reduces gradually in response to any reductions in signal envelope. This means that a relatively long term reduction in the signal envelope level is required before a change in allocation of gain is applied. This avoids more frequent gain changes occurring where the signal envelope level decreases and then increases again within the timescale of the decay time constant. This slow response time reduces the chance that any audible artefacts will be noticeable. Were the gain changes to be implemented with a fast response time to both increases and decreases in signal level then, for an input signal with a signal envelope level that varies repetitively in a relatively fast timescale, any artefacts occurring due to the gain changes may be relatively repetitive and relatively in-sync with the signal and, as such, may become noticeable to a user. However any gain changes of an envelope detector 105 with a relatively slow decay time constant will occur relatively infrequently and any occasional glitches will be most likely be masked by the signal content, i.e. a user may not notice the artefacts as they may be masked by the sound corresponding to the input audio signal.

Such artefacts may not be completely masked however if the part of the signal to which the gain change is applied, corresponds to a low-level or very quiet portion of audio, for example a signal corresponding to, or at near, silence. If the level of digital input signal (pre-scaling) is relatively low, e.g. corresponding to a relatively quiet portion of audio, the resultant analogue output signal (post-scaling) will also be low-level. The effect of any artefacts associated with the gain changes at this part of the signal may be perceptible above any actual signal contribution. In other words, the sound produced by the audio signal component at that point may not be sufficient enough to mask the audio artefact (especially if the loudspeaker is very sensitive, e.g. an earbud loudspeaker, or if there is further downstream amplification of the analogue output signal). Thus at a transition from a non-quiet portion of a signal to a quiet portion, for instance at the end of an audio programme such as at the end of a music track or similar, the gain changes due to dynamic gain control variation may lead to audio artefacts occurring during the quiet portion which are noticeable to a listener.

For example consider an audio data stream corresponding to a music track. Throughout most of the duration of the track the input signal may have a relatively high signal amplitude level thus corresponding to non-quiet period of audio. In other words if the analogue output is used to drive a suitable loudspeaker with any user controlled volume level set at normal listening levels, the signal would correspond to clearly audible sounds. The digital gain applied during this period will depend on the actual envelope level of the input signal and thus may vary with fluctuations in loudness but may, for example, remain within a range corresponding to small amounts of applied digital amplification.

At the end of the music track, or between successive music tracks, the signal amplitude level may reduce relatively rapidly to a low level which corresponds substantially to silence (albeit possibly with some residual background noise from the original audio source or upstream processing thereof and ignoring any noise anticipated to be added by downstream audio circuitry). The envelope detector 105 will track the reduced signal envelope and the gain select module 106 will consequently progressively increase the digital gain applied to gain module 102 whilst also increasing the analogue attenuation, i.e. reducing the analogue gain, applied to the analogue gain module 103. These gain changes may occur as a series of step changes. Due to the relatively long decay time constant of the envelope detector 105, as described above, the output of the envelope detector 105 will reduce relatively gradually and therefore the series of gain changes may also occur relatively gradually—and more gradually than the reduction in signal amplitude. Thus the gain changes may be applied, at least partly, to a part of the signal where the nominal signal level has reduced to be very low-level. In other words the input signal will have reached a quiet portion during the time in which the gain changes are being applied. Thus any audible artefacts due to the changes in gain made when the signal content is at this very low level may be audible.

Embodiments of the present invention thus relate to digital-to-analogue conversion circuits having a digital input for receiving an input digital signal and an analogue output for outputting an analogue version of the input digital signal, with a digital-to-analogue converter located in a signal path between the digital input and analogue output and having a DAC input, i.e. an input to the DAC for receiving a digital signal to be converted. The conversion circuit also has a digital variable gain element configured to apply a digital gain between the digital input and the DAC input and an analogue variable gain element configured to apply an analogue gain between the DAC input and the analogue output. The digital variable gain element may be any element that applies a desired gain to the digital signal upstream of the DAC input, i.e. an element that modulates the amplitude of the digital signal before it is received by the DAC. The analogue variable gain element may be any element that applies a desired gain to the analogue signal downstream of the DAC input, i.e. an element that modulates the signal amplitude of the analogue signal produced by the DAC. In some embodiments there may be an analogue gain element downstream of the DAC which acts on the analogue signal output from the DAC but in other embodiments, as will be described later, the function of the analogue gain element may effectively be included within or otherwise associated with the functionality of the DAC. Thus reference to applying an analogue gain between the DAC input and the analogue output also includes modulating the conversion gain of the DAC itself, e.g. by modulating a DAC reference voltage/current instead of, or in addition to, gaining-up an already-generated analogue data signal.

The conversion circuits also include a gain controller which comprises a gain allocation module. The gain allocation module is configured to control the allocation of gain between said digital variable gain element and the analogue variable gain element in response to changes in a signal level of the input digital signal. In embodiments of the present invention the gain allocation module is operable in first and second modes of operation wherein the response of the gain allocation module to reductions in said signal level of the input digital signal is slower in the first mode than in the second mode of operation, i.e. the time taken for all gain changes associated with a given change in signal level may be longer in the first mode than in the second mode. The gain controller also comprises a low-level detector configured to monitor the input digital signal at the digital input so as to detect a low-level part of the signal. The gain controller is configured to change said gain allocation module from said first mode of operation to said second mode of operation following detection by said low-level detector of a low-level part of the signal.

The gain allocation module is therefore responsive to changes in a signal level of the digital input signal in order to control said digital gain allocation, i.e. to set an appropriate gain for the digital variable gain element and the corresponding gain for the analogue variable gain element. Thus, in a similar manner to that described previously, the gain allocation module varies the amount of digital gain applied so as to allow a greater use of the input range of the DAC and vary the analogue gain accordingly to compensate for changes in the digital gain. Thus, in embodiments of the present invention the gain allocation module is operable in at least first and second modes wherein a response characteristic (e.g. response time or response speed) of the gain allocation module to reductions in signal level of the input digital signal is different in the first and second modes. The change in response speed/time effectively means that the time required to effect all necessary gain changes following a given change in signal level would be shorter in the second mode than the first mode.

In embodiments of the present invention the gain controller also comprises a low-level detector to monitor a digital signal level to detect a low-level part of the signal, which may be a part of the signal where the signal level would not be sufficient to mask any artefacts occurring on a change in gain allocation. The low-level detector may, for example, detect a part of the signal which has a signal level below a first threshold which is preferably chosen so as to correspond to a quiet part of the signal where the level of the signal may not be sufficient to mask any audio artefacts arising on change of the gains applied by the digital and analogue variable gain elements. For instance the threshold may correspond to a signal level that corresponds substantially to silence.

The gain controller is configured such that the gain allocation module changes from the first mode of operation to the second mode of operation following detection of such a low-level part of the signal. Thus the response of the gain allocation module (to reductions of the signal level) is faster following detection of a low-level part of the signal than if a low-level part of the signal is not detected. The change in mode of operation is arranged to occur before the low-level part of the signal reaches the digital variable gain element such that the digital variable element is controlled by the gain allocation module operating in the second mode for at least some time before the low-level part of the signal arrives. Thus the propagation delay in the signal path between the digital input and the digital variable gain element is arranged with respect to the processing time of the gain controller such that a low-level part of the signal can be detected, and the operating mode of the gain allocation module may be timely changed, prior to the low-level part of the signal reaching the part of the signal path where the digital gain change is applied.

It will therefore be clear that the response characteristic of the gain controller to reductions in the signal level of the input digital signal varies depending on whether or not a low-level part of the signal has been detected at the digital input. It will of course be appreciated that there may be additional signal processing and conditioning circuitry upstream of the digital input to the conversion circuit and, in an integrated circuit embodiment, at least some of the upstream circuitry may be integrated with the conversion circuitry. The digital input to the conversion circuitry is therefore simply the part of the signal path at which the low-level detector monitors the input digital circuit.

Provided that a low-level part of the signal is not detected, the gain allocation module operates in the first mode of operation. The response characteristic (to reductions in signal level of the input digital signal) in the first mode may be chosen to be sufficiently slow to reduce the chance of any noticeable signal related distortion resulting from gain changes in a similar manner to that described above—whilst not being unduly slow so that the DAC input range is not used effectively. Thus the response characteristic of the gain allocation module could, for instance, correspond to a sub-audio frequency time constant, e.g. a decay time constant of the order of around 300 ms or so, such that any gain change(s) occur relatively infrequently. As described above this will reduce the chance of any artefacts from being particularly noticeable and any artefacts that do occur will most likely be masked by the signal whilst still providing the benefits of dynamic gain control.

However if a low-level part of the signal is detected the gain allocation module changes to the second mode of operation. In this second mode of operation the response (to signal level reductions) is faster (compared to the first mode) so that any necessary gain change occurs more quickly. This may lead to a greater amount of gain change and/or a greater maximum rate of change of gain being actively and timely controlled in response to a decreasing amplitude input signal. In other words the delay between a reduction in signal level of the digital input signal and completing any resultant gain changes may be reduced (compared to the first mode).

As mentioned above the change from the first mode of operation to the second mode of operation is timely effected before the low-level part of the signal reaches the digital variable gain element. In other words the signal path propagation delay between the digital input and said digital variable gain element, i.e. the time taken to propagate along the signal path from the digital input to the digital variable gain element, is greater than a gain controller propagation delay between arrival of a low-level part of the signal at the digital input and the corresponding change in operating mode of the gain allocation module, i.e. the time required to detect a low-level signal and change operating mode. The signal path between the digital input and said digital variable gain element is thus arranged to have a propagation delay that is equal to a first time period. If the propagation delay of the gain controller is such that the time between arrival of a low-level part of the signal at the digital input and the corresponding change in operating mode of the gain allocation module is equal to a second time period, the signal path propagation delay is arranged with respect to the gain controller propagation delay such that the first time period is greater than the second time period by an amount equal to a third time period. It will be appreciated that the third time period represents the amount of time the gain controller operates in the second mode before the low-level part of the signal (that triggered the change to the second mode) reaches the digital variable gain element. As will be described in detail later there may be one or more delay elements in the signal path between the digital input and the digital variable gain element to provide a sufficient propagation delay.

Switching to the second mode of operation of the gain allocation module, with a faster response to signal level reductions, on detection of the low-level part of the signal means that a greater amount of gain change may be implemented in a period just before the low-level part of the signal arrives at the digital variable gain element than would be the case if purely operating in the first mode of operation. This can reduce the amount of gain adjustment, if any, implemented during the subsequent low-level part of the signal, where artefacts arising from gain changes may not be readily masked by the signal. Changing to the second mode of operation can thus reduce the possibility of audible artefacts during a quiet portion of the audio that would not be masked by the audio, as compared to operating purely in the first mode of operation with a relatively slow response time.

The response characteristic of the gain allocation module in the second mode of operation may therefore be configured together with the third time period discussed above to ensure that a substantial proportion of any likely gain adjustments may be implemented before arrival of the low-level signal at the digital variable gain element. The response characteristic of the gain allocation element in the second operating mode, i.e. the time required to implement any likely gain changes, may therefore be chosen with regard to the likely rate of change of signal envelope on transition to a quiet portion of the audio. For many audio tracks the audio may fade naturally or artificially to a quiet portion. Thus there may be a short period during which the signal amplitude level may reduce from possibly a relatively high level to become low-level, e.g. corresponding substantially to silence. The response characteristic of the gain allocation module in the second operating mode may therefore be arranged such that, were the input signal to exhibit a steady decrease from at or near a maximum signal level to become low-level in a period equal to the expected fading period, then the majority of, or preferably substantially all, gain adjustments associated with such reduction in signal level may be implemented during the second mode of operation before the low-level signal arrives at the variable digital gain element, e.g. during a period equal to the third time period referred to above. As the fading period may be relatively short preferably the response time in the second mode is relatively fast. Operating with a relatively fast response characteristic (e.g. response speed/time) in this way thus reduces the likelihood of any gain adjustments being implemented on the low-level part of the signal as most necessary adjustments will have been implemented before the low-level part of the signal is received at the digital variable gain element. Whilst this may result in a greater amount of gain adjustment in the period leading up to the low-level portion of the signal, during such a transition the signal level is likely to be continually dropping and so the likelihood of repetitive artefacts signal linked to signal level increases and decrease resulting in a noticeable distortion is less likely to occur than say during the main body of music track. In any case audio artefacts arising from such gain changes in this brief period may be masked by the signal component (even as it is fading) and will be less noticeable than were the gain changes to be implemented on the low-level part of the signal. Thus by changing to the second mode of operation when a low-level part of the signal is detected any audio artefacts resulting from gain adjustments occur during the non-quiet portion preceding the quiet portion, which provides a better listening experience.

It will be appreciated that were the gain allocation module to operate in the second mode of operation for a long period of time prior to the low-level portion of the audio signal then the possibility of signal related artefacts being noticeable would be higher. Partly for this reason the third time period referred to above may be limited to a period which is just sufficient to allow all likely gain changes associated with a transition to a quiet portion to be implemented when operating at the response time of the second mode of operation. Additionally the third period referred to above may be limited by the desire to keep the signal path propagation delay as short as possible to avoid introducing unnecessary latency into the signal path.

The third time period and the response characteristics of the two modes of operation may be such that in the first mode, the time required for the gain of the digital variable gain element to change from a first digital gain allocation to a second digital gain allocation (following a corresponding change in the input digital signal level) would be greater than the third time period. In other words, to change the gain allocation by a certain defined amount would take longer than the third time period. In the second mode however the time required for the gain of the digital variable gain element to change from the same first digital gain allocation to the second digital gain allocation (assuming a steady change in signal level) following the change in mode would be lower than the first time period. In other words if the signal level was such to require a change from the first gain allocation to the second gain allocation this could be implemented within the third time period. The first gain allocation may be at or near a minimum gain allocation used in practice and the second gain allocation may at or near the maximum gain allocation (suitable for the low-level signal). It will be appreciated that the response characteristic in the first mode may be slow enough that said gain change from first to second gain allocation in the first mode would require a period greater than the first time period.

Put another way the response characteristic in the second mode is preferably sufficiently fast with regard to the third time period such that substantially all adjustments in digital gain allocation from the current level to the target level (appropriate for the low-level part of the signal) may be implemented in the third time period. The response characteristic in the second mode may correspond to a decay time constant of the order of a few microseconds, say in the region of 1 μs to 30 μs, for instance around 10 μs or less. The third time period may be of the order of a few hundred microseconds and so the period of operation in the second mode before the low-level signal arrives at the digital variable gain element may be of the order of 10 to 50 times a decay time constant in the second mode. It will be appreciated that a time constant of the order of 10 μs or so is several orders of magnitude faster than a decay time constant of 300 ms or so that may be associated with the first mode of operation.

It will of course be appreciated that the discussion referred to above has referred to the third time period being the time available for the gain allocation module to operate in the second mode to implement gain adjustments before the low-level part of the signal is received at the digital variable gain element. In reality there may be a propagation delay corresponding to processing time in the gain allocation module and the time between the gain allocation module outputting a digital gain control signal and the digital gain being implemented. In some instances such propagation delay may include a synchronisation delay between the gain allocation module and digital variable gain element for ensuring that a gain change is implemented at an appropriate time for the signal being received at the digital gain element. If the propagation delay between the gain allocation module outputting a control signal to change the gain of the digital variable gain element and the resultant change in gain of the digital variable gain element is equal to a fourth time period, then the third time period mentioned above may be greater than the fourth time periods by an amount equal to a fifth time period. In other words the first time period, equal to the signal path propagation delay between the digital input and digital gain element, is greater (by an amount equal to the fifth time period) than the sum of the fourth time period and the second time period, i.e. the gain controller propagation delay for detecting a low-level part of the signal and changing to the second operating mode. It is therefore the fifth time period that is the amount of time that the gain allocation module has to generate a control signal for generating a change in gain that will be implemented before the low-level signal reaches the variable digital gain element.

Figure 1:
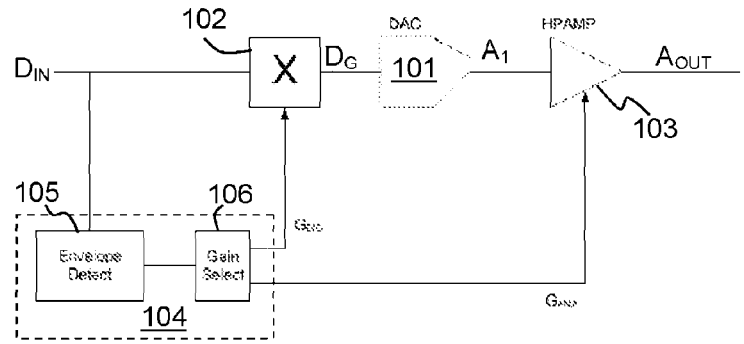
FIG. 1 illustrates a conventional digital-to-analogue conversion circuit with dynamic gain control.
Figure 2:
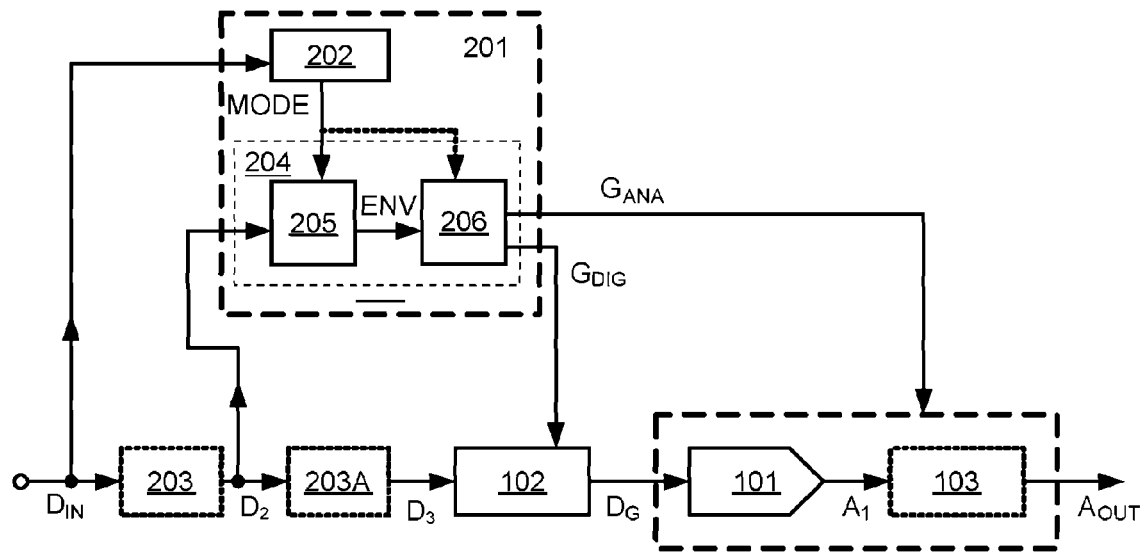
FIG. 2 illustrates a digital-to-analogue conversion circuit with dynamic gain control according to an embodiment of the present invention.

FIG. 2 illustrates one embodiment of the invention. Components which are similar to those shown in FIG. 1 are identified using the same reference numerals. Again there is a signal path for receiving a digital input signal $D_{IN}$ and outputting an analogue output signal $A_{OUT}$. As mentioned above $D_{IN}$ represents the start of the conversion circuit signal path which may be part of a larger signal path with upstream circuitry for producing, retrieving, processing and/or conditioning an earlier version of the input signal $D_{IN}$. Some of the upstream processing may operate on a digital signal at a different sample rate and/or resolution. Likewise there may be additional processing circuitry downstream of the analogue output $A_{OUT}$ of the conversion circuit.

This conversion signal path includes a DAC 101, digital variable gain element 102 and analogue variable gain element 103. In this embodiment the gain of the digital and analogue variable gain elements are controlled by a gain controller 201, by gain control signals $G_{DIG}$ and $G_{ANA}$ respectively.

The gain controller 201 includes a low-level detect module 202 which monitors the signal level of digital input signal $D_{IN}$ and a gain allocation module 204 for generating appropriate gain control signals $G_{DIG}$ and $G_{ANA}$. The low-level detect module 202 determines the input signal level at the digital input (to the conversion signal path) and determines whether the signal level corresponds to a low-level signal, e.g. a portion of the signal which would be quiet or substantially silence. The low-level detect module 202 may for instance determine whether the signal level of the input signal $D_{IN}$ is at or below a first threshold. The first threshold may be set, as described, to correspond to a quiet period of the audio. In other embodiments however the low-level detect module may detect a characteristic associated with a low-level, e.g. quiet, portion of the audio signal by other methods such as filtering or FFT/spectral analysis, or assessing various signal parameters, for instance using a look-up table. Particularly for speech applications it may take the form or use well known techniques in the art of Voice Activity Detectors.

The gain controller 201 also comprises a gain allocation module 204 which may, for example, comprise an envelope detector 205 and a gain select module 206. The envelope detector 205 may monitor a digital signal $D_2$. In some embodiments the signal $D_2$ received by the envelope detector may be the same signal as $D_{IN}$. However in other embodiments, as will be described later, $D_2$ may be a delayed version of $D_{IN}$, possibly delayed by at least one delay element 203 in the signal path.

The envelope detector determines a signal envelope level for the digital signal $D_2$ and outputs a signal, ENV, indicative of this value. The envelope value signal ENV is received by the gain select module 206 which determines appropriate control signals $G_{DIG}$ and $G_{ANA}$ for the digital and analogue gain elements respectively.

If the low-level detect module 202 detects a low-level part of the signal, e.g. detects that the signal $D_{IN}$ drops past the first threshold, it generates a mode control signal, MODE, that causes the gain allocation module to change from a first mode of operation to a second mode of operation. As described previously in the first mode of operation the response time to reductions in signal levels of $D_{IN}$ is slower than in the second mode.

In one embodiment the mode control signal may be applied to the envelope detector 205 to change a response speed/time characteristic, for instance to reduce a decay time constant of the envelope detector and/or reduce a hold time of the envelope detector, possibly to zero. In which case the output of the envelope detector preferably corresponds to a delayed version of $D_{IN}$. As mentioned previously there may therefore be at least one delay element 203 incorporated within the signal path so that the envelope detector acts on a signal $D_2$ which a delayed version of $D_{IN}$. The delay element 203 may be a dedicated delay or may comprise at least one signal processing or conditioning element, such as an interpolation filter and/or upsampler or the like, that introduces a delay into the signal path. The delay circuitry 203 may be sufficient such that the low-level detector 202 has time to detect a low-level part of the input signal and generate a mode change, i.e. control, signal which is acted upon by the envelope detector before the low-level part of the signal reaches the envelope detector 205. In this way the mode change of the envelope detector is implemented whilst it is acting on the part of the signal preceding the low-level part of the signal. With such a delay 203 in the signal path this also ensure that the mode change occurs before the low-level part of the signal reaches the digital variable gain element. There may in some embodiments be an additional delay 203A in the signal path between the tap point for the envelope detector and the digital variable gain element 102 to allow time for the envelope detector processing and to ensure sufficient time of operation in the second mode to implement substantially all necessary gain adjustments.

It will be appreciated however that at least some delay could be applied within the envelope detector 205, i.e. it could buffer the input signal $D_2$ (which may then be the same signal as $D_{IN}$) before determining the envelope level. Alternatively the envelope detector could operate with a fast response, e.g. a fast decay time constant (fast enough for operation in the second mode of operation) and then buffer an intermediate envelope value for a period before applying some filtering or processing based on the current mode setting to provide the desired response characteristic, before outputting the ENV value. If delay 203 is not present then delay 203A may be used to apply all necessary delay within the signal path.

Additionally or alternatively the mode control signal may be received by gain setting module 206. The gain setting module 206 may then receive the ENV value from the envelope detector 205, which may have a relatively fast response (e.g. fast decay time constant) in this embodiment. The gain setting module 206 then determines appropriate gain control signals according to the mode of operation to provide the desired response characteristic. In this embodiment the gain select module may delay or buffer the signals received from the envelope detector before determining appropriate gain control signals so again the gain select module is effectively considering the gain changes to be applied to an earlier part of the signal when the low-level part of the signal is detected and the mode changed.

In some embodiments the gain controller 201 may be configured, together with any delay element(s) 203, 203A such that, if a low-level signal is detected at the digital input, the mode of operation of the gain allocation module is changed, so that response time to signal level reductions is reduced so that substantially all gain changes associated with the digital signal level dropping to the first threshold are implemented before the low-level part of the signal reaches the digital variable gain element. Thus by the time the low-level part of the signal is reached substantially all necessary gain changes have been implemented, i.e. a target digital gain allocation suitable for the low-level part of the signal has been reached. This means there will be substantially no further gain changes as long as the signal remains at a low-level. Thus there will be substantially no audible artefacts due to gain changes during the quiet portion of the audio.

The low-level detect module and/or gain allocation module could be implemented in a number of different ways, for example by a suitably programmed Digital Signal Processor or the like or by dedicated electronic circuitry. Operational parameters of these modules may be hard-wired, programmed in local non-volatile memory, stored in local memory written to at start-up or re-initialisation, or programmable in operation by communication with some host device to tailor the performance to a current user application or environment.

In general, as the change in mode of operation should be implemented before the quiet part of the signal is reached— but it is still beneficial to ensure that gain changes are appropriate for the actual part of the signal to which they are being applied—the gain allocation module may be arranged to determine an appropriate gain change to be applied to a part of the signal based on whether a subsequent part of the signal is a low-level part.

It is also possible, as will be described in more detail later, that at least some of the functions of the low-level detect module 202 and envelope detector 205 may be combined.

The gain select module outputs control signals to apply relevant digital and analogue gain factors, $G_{DIG}$ and $G_{ANA}$ respectively. The digital gain signal is provided to the digital variable gain element 102. The analogue gain signal may be provided to an analogue gain element 103, which may be downstream of the DAC 101 but, in some embodiments (as will be described in more detail later) the analogue gain element may be functionally combined with the DAC and so the control signal may be provided to the DAC 101, for instance to modulate the conversion gain. For the avoidance of doubt it will be appreciated that the digital gain control signal is a signal for controlling the digital gain and may take any form. Thus the control signal may itself be a digital signal or may be an analogue signal. Likewise the analogue control signal is for controlling the analogue gain and may itself be a digital signal.

FIG. 3 illustrates a digital-to-analogue circuit 300 according to an embodiment of the invention. In this embodiment the input digital signal $D_{IN}$ is monitored at a first point in the signal path, i.e. at the digital input, by gain controller 301. The signal $D_{IN}$ is received by low-level detect module 302. The low-level detect modules determines whether the signal level $D_{IN}$ is at or below a first threshold in order to detect a low-level part of the signal. The first threshold may be fixed or may, in some embodiments, be configurable by a LOW_LEVEL control signal, for instance by setting a suitable reference level. The low-level detect module may be arranged so as to only indicate that a low-level signal has been detected if the level of digital signal $D_{IN}$ remains below the first threshold for a predetermined period of time, $T_{LOW}$. Thus the low-level detect module may compare the digital signal level with the threshold level for a period of time equal to $T_{LOW}$ and only flag a low-level signal if the signal level remains below the first threshold for all that period. The duration of $T_{LOW}$ may be fixed or may be configurable by control signal TLOW. This will avoid changing the gain rates unnecessarily for only momentary low-levels in the signal and instead only highlight parts of the signal where the signal has transitioned to a quiet portion. Since a low-level part of the signal is only detected if the signal level monitored remains at or below the first threshold, the low-level detect module can therefore act on the instantaneous signal level and will not falsely trigger due to zero crossings of the signal. This can advantageously avoid the need for any envelope detection at this stage of the processing. A smaller threshold value will advantageously allow a smaller duration $T_{LOW}$ to be used when detecting a low-level part of the signal (when looking at instantaneous signal level the first threshold will effectively specify a threshold band about zero—ignoring any dc offset—and clearly the time taken to traverse the band will depend on threshold level). Too low a threshold however will be sensitive to system noise and may thus fail to trigger. A threshold of 60 dB below peak signal and a duration of the order of 10 μs may be appropriate for audio applications.

A digital signal $D_2$ at a second point in the signal path is monitored by envelope tracker 305 of gain allocation module 304. The envelope tracker 305 determines the signal envelope of the digital signal $D_2$ and supplies the signal envelope value to gain setting module 306, optionally via delay 303 which may be provided so as to synchronise the gain changes throughout the appropriate elements within the signal path.

The envelope tracker 305 preferably has a fast attack time constant so that it reacts quickly to any increases in signal level, thus ensuring that the digital gain applied by digital gain element 102 can be reduced, if necessary, in time to prevent clipping of the digitally amplified signal input to the DAC 101. The decay time constant of the envelope detector 305 is variable. In one embodiment the decay time constant may be variable between a first decay time constant, which is used during relatively continuous audio, and a second decay time constant which is used when a low-level signal is detected. These time constants may be fixed, programmed and stored locally or may be specified by control signals ENV_TC and ENV_TC_FAST respectively. As described above, the first decay time constant may, for example, be of the order of 300 ms or so. The second decay time constant may, for example, be of the order of 10 μs or so. In some embodiments, as will be described later, the envelope tracker may also implement a hold time which may also be altered, e.g. reduced or omitted altogether, in the second mode.

The relevant time constant used is set by the output of low-level detect module 302. Thus the low-level detect module supplies a mode select signal, MODE, to the envelope tracker 303 to select the fast decay time constant in a second mode of operation if a low-level part of the signal $D_{IN}$ is detected or otherwise to use the normal, slower, decay time constant in a first mode of operation.

Between the first point of the signal path, where the input signal is monitored to detect a low-level portion of the signal, and the second point of the signal path, wherein the signal $D_2$ is used for envelope tracking, there is a delay $T_{12}$. This delay $T_{12}$ may be greater than the time required for a low-level signal to be detected and the time constant of the envelope tracker changed. In other words the delay $T_{12}$ is preferably greater than the period $T_{LOW}$ and any time required for processing delays. A delay $T_{12}$ of the order of 100-200 μs may be appropriate for audio applications.

The delay $T_{12}$ may be implemented, at least partly, by means of delay element 307. This could be a dedicated delay element but in some embodiments the delay element 307 may also comprise a signal processing/conditioning element for applying some signal processing/conditioning. For instance element 307 may comprise an interpolation filter that acts on the input digital signal $D_{IN}$ to produce an interpolated digital signal $D_2$ at a greater sample rate. Interpolation of the input signal $D_{IN}$ may put the digital signal in a better form to benefit from the pre- and post-conversion scaling (although in some embodiments any such signal conditioning may be performed before the input digital signal is received by the circuit 300). Using an interpolation filter as at least part of delay element 307 thus may make use of inherent delays already present in the signal processing chain and thus advantageously avoid extra hardware and/or processing effort. Also as signal $D_{IN}$ is monitored by the low-level detect module 302 prior to interpolation by delay element 307 the low-level detect module may operate at a lower sample rate and/or with different resolution than the envelope tracker 305 which receives the interpolated signal $D_2$. For the avoidance of doubt, the gain allocation module may respond to changes in signal level of a signal $D_2$ which may be an upsampled and/or interpolated version of $D_{IN}$ and thus which could be at a different resolution and/or sample rate. The changes in signal level of $D_2$ are however responsive to, i.e. conditional upon, changes in the signal level of $D_{IN}$ and thus the gain allocation module in such applications is responsive to changes in signal level of the input signal $D_{IN}$.

In addition there may optionally be a further delay element 307A between the second point of the conversion signal path and the digital gain element 102. Again this may a dedicated delay element or could comprise signal processing elements such as an interpolation filter. Again it may be desirable to have the envelope detector operate on a lower sample rate/resolution signal than is supplied to the DAC so as to reduce complexity or processing effort of the envelope tracker. In addition it may be desired to have a delay in the signal path to allow time for processing in the envelope tracker.

Figure 4:
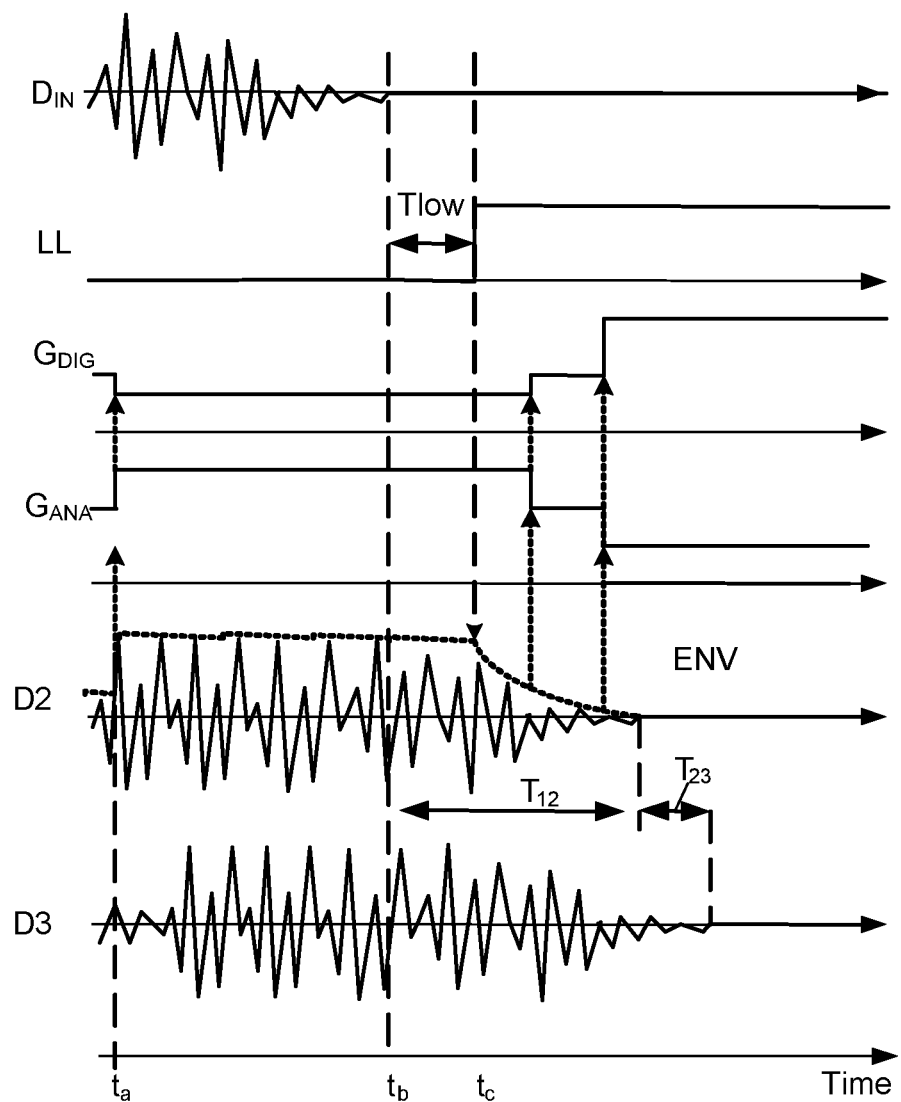
FIG. 4 illustrates various signal waveforms at various parts of the circuit shown in FIG. 3.

FIG. 4 illustrates the principles of operation of the circuit shown in FIG. 3 and shows various waveforms at various parts of the circuit.

The first waveform shown at the top of FIG. 4 illustrates part of the digital signal $D_{IN}$ at the first point in the conversion signal path, i.e. it indicates the digitally coded input signal received at the low-level detect module 302. The next waveform down illustrates the output, LL, of the low-level detect module. It can be seen that at a time $t_b$ the signal level of digital signal $D_{IN}$ reduces to be very low-level, corresponding to a quiet period of the audio signal. At this point the signal level of signal $D_{IN}$ may be below the first threshold. However it is only at time $t_c$, when the signal level of $D_{IN}$ has remained low (below the first threshold) for a period equal to $T_{low}$ that the output LL of the low-level detect module goes from low to high.

FIG. 4 also shows a waveform corresponding to the digital signal $D_2$ at the second point in the signal path. It can be seen that the signal $D_2$ is delayed with respect to the signal $D_{IN}$ by a delay period equal to $T_{12}$. The digital signal $D_2$ is received by the envelope tracker and used to derive an envelope value which is represented by the dotted line.

FIG. 4 illustrates an example where, just prior to a time $t_a$ the signal $D_2$ received at the envelope tracker has a medium amplitude level. At time $t_a$ the amplitude of the signal $D_2$ increases. The envelope detector has a fast attack time and thus the envelope value also thus sharply increases at this point. It will of course be noted that the signal $D_2$ is a delayed version of $D_{IN}$ and thus this feature would have been present at the first point in the signal path at an earlier point in time.

The envelope value is used by the gain select module 306 to control the gains applied to the digital and analogue variable gain elements, which are shown in FIG. 4 as gain factors $G_{DIG}$ and $G_{ANA}$ respectively. Just prior to time $t_a$ the gain factor $G_{DIG}$ which was determined to be applied to the digital signal, had been relatively high so as to amplify the digital signal with a mid-level amplitude to use most of the input range of the DAC. At time $t_a$ the signal amplitude (of signal $D_2$) increases and thus the gain factor $G_{DIG}$ to be applied is reduced so as to reduce the level of amplification applied, so that the digital signal received by the DAC remains within the input range of the DAC. At the same time the gain factor $G_{ANA}$ to applied to the analogue signal is adjusted in an complementary manner, i.e. the gain applied is increased (in order words the attenuation is reduced) at time $t_a$ to compensate for the reduced digital amplification.

It will of course be appreciated that the change in gain factors determined at time $t_a$ may actually be deliberately delayed so as to be applied to the digital and analogue gain elements at later times which are synchronised to when the relevant part of the signal is received by the relevant gain element.

Between time $t_a$ and $t_c$ the envelope tracker produces an envelope value which follows the signal envelope but with a relatively slow decay time constant. Thus the envelope value does not reduce rapidly, but it does rise quickly. Thus the result is that although the signal amplitude varies, and drops to a level comparable to that before time $t_a$, the overall envelope value remains at roughly the same level. Thus there are no changes in the gain factors applied during this time. Having a relatively slow decay time constant thus avoids frequent changes in gain. It also reduces any requirement for time-synchronising the application of gain changes.

At time $t_c$ however the low-level detect module output, LL, goes high, indicating that the signal $D_{IN}$ corresponds to a quiet portion of audio. In response to the low-level detect output going high the mode of operation of the gain allocation module is changed, and the decay time constant of the envelope tracker is reduced (i.e. a faster time constant is used) to provide a faster response. It can be seen that the period $T_{low}$ required to detect a low-level part of signal $D_{IN}$ is less than the delay $T_{12}$ between signal $D_{IN}$ and $D_2$ and thus the decay time constant of the envelope tracker is reduced before the low-level part of the signal is received by the envelope tracker. In the example described in FIG. 4 the period $T_{low}$ is therefore equal to the second time period referred to above (ignoring any additional processing delays for ease of explanation).

Once the decay time constant is reduced the envelope value reacts more quickly to the signal reduction. Thus in this example the envelope values ramps downwards quite quickly. This may lead to some changes in the determined gain factors $G_{DIG}$ and $G_{ANA}$, for example FIG. 4 shows two steps changes increasing the digital amplification and correspondingly increasing the analogue attenuation during this period of relatively rapid ramping down of the envelope value. However it will be seen that if these gain changes are applied to the corresponding parts of the signal by the digital and analogue gain elements the gain changes will occur during the period that the signal amplitude level is decreasing and before the low-level quiet period is reached. Thus there will still be audio components to mask any artefacts due to the gain changes at the times that the gain changes are made.

FIG. 4 also illustrates the digital signal $D_3$ which is received by the digital gain element 102 and to which a gain adjustment based on the gain factor $G_{DIG}$ may be applied. The signal $D_3$ may be delayed with respect to the signal $D_2$ by a delay $T_{23}$. The delay $T_{23}$ may be provided to allow for the processing time of the envelope detector and the gain selector module and any propagation delay between generating a gain control signal $G_{DIG}$ for changing the digital gain and the corresponding gain change being implemented. The delay $T_{23}$ may be particularly useful to allow the envelope detector time to react to an increase in signal level and the gain allocation module to generate a gain control signal to reduce the digital gain applied before the increased signal level is received at the digital variable gain element. In some embodiments the delay $T_{23}$ may be substantially matched to the propagation and processing delays of the gain allocation module. In other words the time between a particular part of the signal arriving at the second point in the signal path and subsequently arriving at the digital variable gain element may be substantially matched to the time taken to determine the signal envelope of that particular part of the signal and, if a change in gain is deemed necessary (based on the current response time), to implement said gain change.

In some embodiments however the delay $T_{23}$ may be longer than the processing and propagation delay required by the envelope detector, gain select module and digital variable gain element. This would mean that the gain adjustments being implemented at the digital variable gain element would be slightly divorced from the signal level changes used to determine said adjustments. However for some applications this may be sufficient. For example in FIG. 4 one could imagine the changes in gain factors $G_{DIG}$ and $G_{ANA}$ determined based on $D_2$ being implemented on the signal at $D_3$ without any significant delay. The reduction in digital gain at time $t_a$ would be implemented before the signal at $D_3$ exhibited the signal level increase and, in the first mode of operation the slow decay time constant may prevent the digital gain being increased too soon. In the second mode of operation for well behaved signals the delay $T_{23}$ and response time in the second mode may be such so that it is unlikely that a gain change from a reduction in signal level is implemented before such signal level change also occurs at the digital variable gain element. In such situations the delay $T_{23}$ may provide some additional time to implement any necessary gain changes in the second mode of operation before the low-level part of the signal is received.

In the simple example discussed with relation to FIG. 4 the signal path propagation delay between the digital input and the digital variable gain element, i.e. the first time period discussed above, may be seen as equal to $T_{12}+T_{23}$. As mentioned the second time period may be seen as equal to $T_{low}$. Therefore the third time period, equal to the time between switching mode to the second mode of operation and the low-level signal being received at the digital variable gain element is thus equal to $T_{12}+T_{23}-T_{low}$. If the delay $T_{23}$ is substantially matched to the propagation delay associated with processing within the gain allocation module and outputting and implementing a gain change control signal then the fourth time period discussed above may be seen as $T_{23}$ in which case the fifth time period can be seen as $T_{12}-T_{low}$.

It should be noted that if $T_{low}$ were to be greater than $T_{12}$ the low-level part of the signal would have been received by the envelope detector before the mode of operation changes to the second mode. At the point that the second mode of operation is implemented the signal level at the envelope detector will therefore already be low-level. The value of ENV will therefore ramp down towards a very small value as fast as allowed by the fast decay time constant in the second mode. Provided that in such an arrangement the delay $T_{23}$ is sufficiently greater than the time required to implement a gain change, it may therefore still be possible to implement substantially all the resultant gain changes before the low-level part of the signal is received at the digital variable gain element. However such an arrangement would mean that the gain changes implemented in the second mode of operation were implemented in the last non-quiet portion of the signal without being linked to the actual signal level changes exhibited at this part of the signal. In some instances this may lead to clipping of the signal. It is therefore preferred that the delay $T_{12}$ is greater than $T_{low}$ by an amount sufficient to allow substantially all necessary gain changes, for a normally fading signal, to be implemented before the part of the gain allocation module where the response time is implemented receives the low-level part of the signal.

Figure 5:
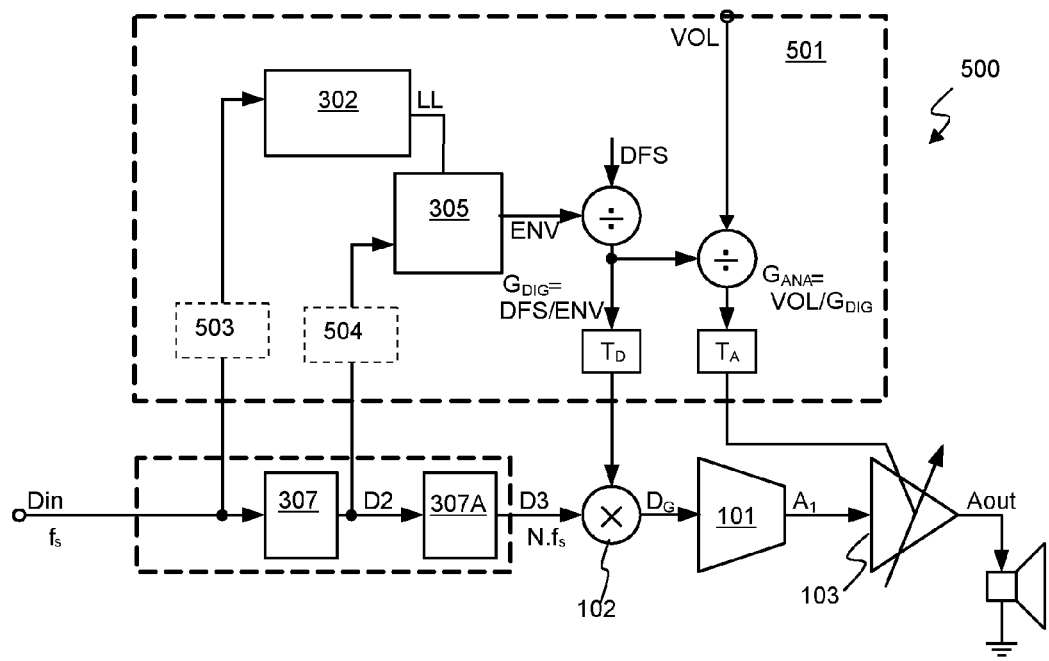
FIG. 5 illustrates a further embodiment of the present invention.

FIG. 5 illustrates a further embodiment of the invention which incorporates a user volume control. FIG. 5 illustrates a DAC chain, which accepts a digital input signal Din at a sample rate $f_s$ and outputs an analogue signal Aout to a load, such as a speaker in this example. The output amplitude may also be modified according to a received digital gain or volume signal VOL received by the gain controller 501.

As discussed previously the input digital signal Din may be upsampled and filtered possibly through several stages, for example to produce an interpolated signal $D_3$ at a higher sample rate (say $N \cdot f_s$ where N=64 for example).

In this embodiment the pre- and post-conversion scaling factors $G_{DIG}$ and $G_{ANA}$ are determined taking the DAC gain and the user controller volume into account. The gain factor $G_{DIG}$ may be derived as discussed previously to ensure that the signal input to the DAC 102 uses most of the available input range of the DAC. Thus the gain factor $G_{DIG}$ may be determined by determining the ratio DFS/ENV where DFS is the value of digital full scale input for the DAC and ENV is the current envelope value. In practice however the value $G_{DIG}$ may be changed in steps based on, for example a look-up table (not shown). The gain factor $G_{ANA}$ is derived as $VOL/G_{DIG}$ where VOL is the user-controlled volume signal. Table 1 below illustrates an example (ignoring user volume for clarity) of the envelope value ENV, expressed in terms of a proportion of the full scale input Fs of the DAC and the resulting gain factors that may be applied (expressed in dB).

TABLE 1

| ENV (Fs) | S (dBFs) | Gdig (dB) | Gana (dB) |
| --- | --- | --- | --- |
| 1.00 | 0 | 0 | 0 |
| 0.89 | −1 | 1 | −1 |
| 0.79 | −2 | 2 | −2 |
| 0.71 | −3 | 3 | −3 |
| 0.63 | −4 | 4 | −4 |
| 0.56 | −5 | 5 | −5 |
| 0.50 | −6 | 6 | −6 |
| 0.45 | −7 | 7 | −7 |
| 0.40 | −8 | 8 | −8 |
| 0.35 | −9 | 9 | −9 |
| 0.32 | −10 | 10 | −10 |
| 0.28 | −11 | 11 | −11 |
| 0.25 | −12 | 12 | −12 |

Assuming for ease that the interpolator filter chain gain is unity, and taking into account the DAC gain of VFS/DFS, where ±DFS is the maximum digital input range of the DAC and ±VFS is the corresponding maximum analogue output signal range, the output Aout is given by $A_{OUT} = (Din/DFS) \cdot VFS \cdot G_{DIG} \cdot G_{ANA}$. If the post-conversion scaling gain is $G_{ANA} = VOL/G_{DIG}$ then the output $A_{OUT} = (Din/DFS) \cdot VFS \cdot VOL = Din \cdot G_C \cdot VOL$ where $G_C$ is the nominal conversion gain of the DAC.

In practice $G_{ANA}$ may be limited resolution, lower resolution perhaps than even VOL, to ease design of the analogue post-scaler, and some extra headroom may be desirable for design ruggedness. Also some or all of $G_{ANA}$ may be implemented as modifying the conversion gain of the DAC from its nominal value.

Note the digital full scale, for say an N-bit signal, may be less than $2^N$. A delta-sigma modulator will overload and may go unstable for outputs close to 0% or 100% duty cycle, so preferred input signal may be reduced by or restricted to a deliberate maximum modulation index, say 90% or less. Also the performance in terms of say distortion may already start degrading as the input approaches this modulation index, so the DFS value used may be reduced further, except perhaps when the maximum possible output signal is required. In other words, DFS may actually be signal-dependent, with a maximum range only allowed when necessary to achieve a maximum output power greater than otherwise possible.

FIG. 5 illustrates that the control paths for control signals $G_{DIG}$ and $G_{ANA}$ may include respective delays $T_D$ and $T_A$. As mentioned previously these delays may be provided to assist in synchronising the control signals to the appropriate parts of the signal. The delay $T_A$ may be adjusted relative to delay $T_D$ in order to take account of any propagation delay within the digital gain element 102 and/or the DAC 101. Also the analogue gain element 103 may require some time for any gain change to become effective. In other words there may be a delay associated with the analogue gain element receiving a control signal indicating that a change in gain is required and the resulting gain change being effected. The relative delays $T_D$ and $T_A$ may therefore also take into account any implementation time required by the respective gain element and in some instance the delay $T_A$ (if present) may be less than the delay $T_D$.

FIG. 5 also illustrates that optional filters 503 and/or 504 may be used to filter the signals $D_{IN}$ and/or $D_2$ before being received by the low-level detect module 302 or envelope tracker 305 respectively.

The filter 503 may have a high-pass response or a low-pass response or both (i.e. may be a band-pass filter). Providing a high-pass response will mean the low-level detect module 302 responds to AC content only. This may be useful if there is any DC offset in the input signal which may be unknown and which may otherwise prevent a reliable low-level detection. Providing a low pass response will useful to ignore high frequency spikes or ultrasonic quantisation noise components that may be filtered by the DAC or an output transducer and thus would not require separate filtering in the main signal path.

The filter 504 may have a similar response to filter 503 and may thus provide similar benefits. In some embodiments however the filter 504 may additionally provide a degree of pre-emphasis to the signal received by the envelope detector 305.

As noted above, a delay between the signal $D_2$ received by the envelope detector and the signal $D_3$ received by the digital gain element is desirable to ensure that when a signal increase occurs there is time for the envelope detector 305 to detect this and to propagate any necessary gain change to the digital gain element before the increased signal level reaches the digital gain element. In some cases there will already be a delay that occurs in some digital signal processing necessary in the signal chain. Thus delay element 307A may be provided which may comprise part of the signal processing, and may be, for example, comprise an interpolation filter.

Increasingly however, integrated circuits such as audio codecs or audio hubs or the like which may utilise embodiments of the invention will include digital processing circuitry operating at a higher sample rates, and thus requiring less interpolation. Thus the inherent delay of an interpolation filter may no longer be sufficient, so extra delay circuitry in the form of a FIFO or RAM may be needed. In addition the interpolation filter may not be a FIR filter, but a minimum-phase IIR filter, to save on chip area and power consumption, with less inherent delay. In some instances the input digital signal may be already be at the required sample rate for the DAC—for instance a signal received from a remote DSD™ audio module or similarly remote sources such as digital microphones or a high sample-rate signal processing circuitry such as found in some ambient noise cancelling schemes. In such applications there may be no interpolation filter in the conversion signal path and hence no significant inherent delay. Providing substantial delays at this sample rate might be expensive in silicon area and power consumption.

In some instances the device or system comprising the conversion circuit may not be tolerant of added delay in the signal path. For example were the conversion circuit to be used in ambient noise cancellation, where a cancellation signal exactly in antiphase with the acoustic ambient noise needs to be generated, the processing delay of the signal processing path should be as short as possible. There may be other similar telecoms applications where increasing a delay of the signal processing path is unhelpful. Also the delay budget in more general signal paths may already be mostly used up by increasingly complex DSP algorithms required for other purposes such as echo cancellation or multi-microphone beamforming.

In some embodiments therefore the filter 504 may comprise a pre-filter for filtering the signal before envelope detection in order to emphasise the effects of any increases in signal level.

FIG. 6a illustrates a filter 504 having a suitable pre-filter for application prior to the envelope detector data input. In this simple implementation, the filter is implemented as parallel paths, one for the original signal and the other a differentiated version thereof. Low frequency components of the relevant input signal ($D_2$) will pass through as before, but high frequency components will be exaggerated. The overall frequency response of this pre-filter will be as shown in FIG. 6b, with a flat response up to a corner frequency fc, and increasing 6 dB/octave above that. Note also that sinusoidal signals above fc will encounter a 90 degree phase lead. This will exaggerate any rising edges, causing a triggering of the envelope detector sooner than would occur. FIG. 6c illustrates how the pre-filter can emphasise the rise in the input signal. Curve 601 illustrates an increase in signal level over time of the input signal and curve 602 illustrates the corresponding signal after pre-filtering. It can be seen that the output of the pre-filter exaggerates the rate of signal increase. Thus consider that the envelope detector is triggered to increase its output value at a certain threshold (represented by the dotted line). The pre-filtered signal 602 will hit this threshold at a time tf, whereas the actual signal will reach this threshold at time ts, after tf. This lead in time (tf−ts) may be enough for the envelope detector to react and change the digital gain in time without a significant delay $T_{23}$.

The use of a pre-filter of the form shown in FIG. 6a prior to an envelope detector to give pre-emphasis to rising signals may be of use for controlling other aspects of an audio processing path. For instance it is known to vary the power supply to stages of an audio processing circuit, such as an amplifier circuit, to reduce the supply voltage at smaller signal levels to reduce power wastage. In such circuits the power supply voltage should be increased quickly in response to increases in signal level and a pre-filter of the type shown in FIG. 6a may be useful in ensuring a quick response to signal level increases.

Referring back to FIG. 4 it is noted that for this example it was assumed that the input audio signal decayed reasonably monotonically before the quiet portion of the audio.

In other words the audio signal fades to silence, which may be the case for most professionally produced audio recordings. However, this may not always be the case and particular for informal recordings, it is quite possible that there is a burst of sound just before the audio goes silent. FIG. 7 illustrates this effect. At time $t_c$ the low-level detect signal goes high as described previously in relation to FIG. 4 and thus the gain allocation module changes to the second mode of operation and the decay time constant of the envelope detector is reduced to give a faster decay response. The envelope value thus starts ramping down quickly with the signal amplitude. At a time $t_d$ however there is a sudden burst of higher amplitude signal. The fast attack time constant of the envelope detector means that the envelope value also quickly increases, possibly resulting in the gain setting module determining that some gain changes are necessary. The burst of higher amplitude signal is relatively brief and thus after it decays away the envelope value starts ramping down again but there is now insufficient time before the quiet period of the audio. Thus there may be further gain changes as the envelope value ramps down during what now corresponds to a low-level portion of the signal.

In order to ensure that substantially all gain changes are implemented by the time that the low-level part of the audio reaches the digital gain element it would be possible to use a very fast decay time constant as soon as the low-level signal is asserted. However this may result in excessive activity during a noticeable amount of time pre-silence.

To avoid such effects, the time constant may be progressively decreased in the second mode of operation, for example in two or more steps. In other words the response time of the gain allocation module in the second mode of operation may be progressively reduced. As illustrated in FIG. 8, on detection of a low-level signal at digital signal $D_{IN}$ the low-level signal LL may be asserted and the decay time constant of the envelope tracker reduced from a first value used in normal operation to a second faster value which is sufficient for normally faded tracks. In addition, a timing pulse TC of width tw1 may be generated from the rising edge of LL and used to further alter the decay time constant at some fixed time, before the expiry of signal delay $T_{12}$. The decay time constant may, when the signal TC goes high, be reduced further to a third value corresponding to a faster still decay time constant.

If the audio signal is one that fades gradually to the quiet period then a significant amount of decay may have occurred during the period of the second time constant. Thus reducing the time constant further for the last period before the quiet part of the signal may not result in much excess activity. However if the signal had not faded gradually and there has been a burst of sound shortly before silence the further increased rate of decay will help ensure that most of the gain changes occur during the last period of non-quiet signal.

In this embodiment the increasingly fast time constant used in the second mode of operation means that any adjustment in gain allocation determined when operating with the fast time constant should ideally be relatively accurately matched to the appropriate art of the signal received at the digital variable gain element. As discussed above therefore the propagation delay in implementing any gain change may be substantially matched to the propagation delay $T_{23}$ in the signal path between the second point (where the envelope detector monitors the signal) and the digital variable gain element. Thus as illustrated in FIG. 8 there may effectively be a delay equal to $T_{23}$ before the digital gain is applied.

This idea may be extended to give several time constants, effectively winding down the time constant in the period before the low-level part of the signal reaches the digital gain element.

As an alternative, instead of progressively adjusting the time constant of the envelope detector in response to detection of a low-level signal the gain setting module could be constrained in some way to prevent an unwanted change of gain. In one embodiment the link between the envelope detection and gain setting could be removed completely in the second mode of operation and instead a managed change in gain allocation may be implemented in accordance with expected signal behaviour, i.e. typical fading characteristics. This may not be ideal however and any signals which did not fit the expected behaviour may be subject to clipping. In another embodiment any increase in envelope level, whilst the low-level signal is still asserted, may be substantially ignored. Again however this could lead to clipping if a high amplitude signal component is received.

Alternatively, the link between gains $G_{DIG}$ and $G_{ANA}$ may be broken, say immediately on LL changing. However, the step-wise reduction in $G_{ANA}$ without increasing $G_{DIG}$ would squelch the signal and give artefacts at every gain change, and this may be noticeable over the duration of the transition to silence. It is therefore preferable to wait until after some delay but still within $T_{12}$. If $G_{ANA}$ has already ramped down to minimum, there will be no further effect. If some last-minute spike has pushed $G_{ANA}$ back up again, then the forced reduction in $G_{ANA}$ will have relatively little effect over the reduced duration. In any case the risk of audible artefacts after silence has arrived is removed.

FIG. 9 illustrates one example of a low-level detector suitable for use in embodiments of the present invention. The digital signal $D_{IN}$ is passed via an absolute level block (to generate signal $D_{IN}'$ which indicates the magnitude of the input signal) to a digital comparator 901. The comparator also receives a reference level Ref corresponding to the first threshold, such as may be set by control signal LOW_LEVEL. The comparator may be arranged to go high when the signal level $D_{IN}'$ is below the reference level. The output from comparator is input to delay 902 which applied a delay equal to $T_{low}$. The output of the delay 902 and is input to AND gate 903 along with a non-delayed version of the output of comparator 901 such that if the signal $D_{IN}'$ remains below the reference level for at least $T_{low}$ then both inputs to the AND gate will go high and the output signal LL will also go high.

Figure 10B:
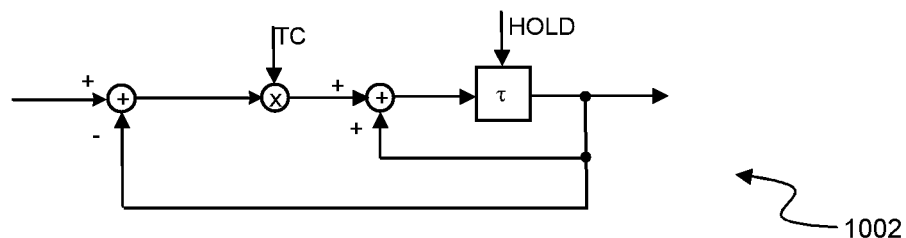

FIG. 10a illustrates on example of an envelope detector suitable for use in embodiments of the present invention. The input signal $D_2$ is passed first through a rectifier or absolute value calculation block 1001 and then through a low-pass filter 1002. The low pass filter 1002 has a programmable time constant set by feedback factor coefficient TC and a HOLD function. FIG. 10b illustrates the low-pass filter 1002 in more detail.

The time constant for the filter is selected by a multiplexer 1003 driven by a comparator 1004 so that when the output of the low-pass filter 1002 is smaller than the output of the absolute block 1001, i.e. the signal level is rising, the low pass filter 1002 will have time constant set by coefficient $T_{ATT}$. This typically corresponds to a very small time constant so that the filter has a very wide bandwidth and tracks the input waveform.

When the output of the filter 1002 is larger than the input it can decay as set by coefficient $T_{DEC}$. In normal operation in the first operating mode (MODE=0) this is set to $TC_{NORM}$. Typically this corresponds to a long time constant so the output smoothly and slowly decays as described previously. When the operating mode is changed to the second operating mode (MODE=1) the time constant coefficient is set to $TC_{FAST}$. Typically this corresponds to a short time constant so the gain is adjusted rapidly.

The low-pass filter operates to subtract the current output value from the input value to generate an error value which is multiplied by the time constant coefficient value TC before being added to the current output value. It will be appreciated that in this embodiment a time constant control signal corresponding to a slow response will have a low value so the output doesn't change by much each clock period and a control signal corresponding to a fast time constant will have a high value.

In normal mode there may also be a hold function unless the input signal is sensed as continuously decreasing (DECN=high) for more than a (programmable) time $T_{HOLD}$, say 1/20 Hz, HOLD is kept high and the low-pass filter output is held at its existing value rather than decaying. In essence the HOLD input essentially stops the clock to the delay element, keeping its output constant. This helps avoid frequent changes when the rectified input signal wanders about close to a constant value.

As mentioned above in some embodiments the functionality of the envelope detector may be at least partly shared with the low-level detector. FIG. 11 illustrates an embodiment of another gain controller 1101 suitable for use in embodiments of the present invention. In this embodiment a low-level detector module 1102 acts on a signal from an envelope detector 1103. The envelope detector 1103 receives the input digital signal $D_{IN}$ and operates, with both a fast attack time constant and a fast decay time constant (suitably fast to provide the required response time in the second operating mode). The low-level detector may therefore simply detect when the signal envelope is low enough to correspond to a quiet portion of the audio for a period equal to $T_{low}$. When a low-level detect signal is detected the low-level detector 1102 may output a mode control signal MODE indicating a change to the second mode of operation. Collectively the low-level detect module 1102 and envelope detector 1103 comprise the low-level detector.

The output from the fast envelope detector 1103 is also received by envelope module 1104. Envelope module 1104 may apply a delay to the envelope signal ENVX produced by the fast envelope detector and then process the delayed fast envelope signal to determine an appropriate envelope value ENV based on the mode of operation. Envelope module 1104 could be a signal processing module or could comprise a secondary envelope detector with a variable time constant. Gain select module 206 may receive the ENV value from envelope module 1104 and operate as described previously. Alternatively as described above the mode control signal may be provided to gain select module 206 which determines whether any adjustments to gain allocation are required based on the operating mode. In such an embodiment the envelope module may simply apply an appropriate delay to the fast envelope signal ENVX and/or may apply some degree of smoothing/filtering to the fast envelope signal. A volume control signal could also be received by the gain select module 206 and optionally also the envelope module 1104. Collectively the envelope detector 1103, envelope module 1104 and gain select module 206 comprise the gain allocation module.

FIG. 12 illustrates a further gain controller 1201 suitable for use in the embodiments described above. In gain controller 1201 the digital input signal $D_{IN}$ is received by low-level detector 202 which operates as described above to generate a mode change signal when a low-level part of the signal is detected. Signal $D_2$, which may be a delayed version of $D_{IN}$, is received at envelope detector 1205. In this embodiment envelope detector 1205 may have a fast decay time constant. The output ENVx of fast envelope detector 1205 may be received by a first gain calculation module 1202. The first gain calculation module may determine a suitable gain control signal based on the fast envelope signal. The first gain calculation module 1202 may determine a general gain control signal or may determine at least one of the gain factors $G_{DIG}$ and $G_{ANA}$ to be applied. The output $G_{DIGX}$ from first gain calculation module 1202, which may effectively be a gain control signal with a fast response time to signal reductions is then input to second gain calculation module 1203 which receives the mode control signal and may apply a hold or exponential decay to the gain control signal in the first mode of operation, but pass the control signal through in the second mode of operation. The output $G_{DIGY}$ from second gain calculation module 1203 may then be received by a third gain calculation module 1204 which may calculate the required gain factors $G_{DIG}$ and $G_{ANA}$ from the general gain control signal or calculate $G_{ANA}$ from $G_{DIG}$, possibly taking a volume control signal into account. The gain factors $G_{DIG}$ and $G_{ANA}$ may then be applied to the digital and analogue variable gain elements as discussed previously.

The digital gain element may be any suitable digital gain element, such as a relatively straightforward digital multiplier as is known in the art. Likewise any suitable variable analogue gain element may be used for the analogue gain element, such as an inverting op amp with programmable resistances as described above.

In one embodiment however the analogue gain-scaling may be performed at least partly within the structure of a DAC. FIG. 13 illustrates a DAC including a variable analogue gain post scaling function.

The DAC 1300 of FIG. 8 comprises three binary-weighted current sources 1301 a-c. The current from each is steered either to the virtual earth node of a transimpedance amplifier comprising op amp 1302 and feedback resistance $R_f$, or to ground, according to the values of respective bits of an input three-bit data word D[0:2].

The gain of this DAC may be controlled by programming the feedback resistor Rf. However, to achieve typically required noise levels, the value of this resistance is typically less than 2 kohm. Thus to reduce the gain by even 20 dB would require reducing the value of the feedback resistance to of the order of 200 ohms. Further gain reduction becomes impractical, due to the large physical size of MOS switches needed to programme this resistor without degrading gain accuracy because of the switch resistance or introducing distortion due to variations in the switch resistance. Note that reducing Rf by say a factor of two will reduce the signal gain by a factor 2, i.e. 6 dB, and will also attenuate any upstream noise, e.g. due to the current sources by 6 dB.

The gain of the DAC could be reduced by scaling the DAC reference current from which the current sources are mirrored. Ideally this should reduce the current noise by 3 dB. However because of the square-law MOS characteristic, reducing the current by a factor of 2 by reducing the gate drive would only reduce the output current noise by 1.5 dB. Also as the current sources are typically implemented with MOS transistors, with the current defined by the gate voltage, substantially reducing the reference current would require reducing the gate voltage. This could exacerbate any mismatch due to inevitable random threshold voltage differences introduced during manufacture.

In one embodiment therefore the gain is at least partly controlled by altering the duty cycle of the injected current. The duty cycle may be modulated by modulating the pulse width of a common pulse-width control signal PW as illustrated. In a conventional DAC of this type the currents may be gated to give say a 90% duty cycle to avoid inter-symbol interference effects between one digital sample and the next. If the duty cycle is controlled the output voltage and hence analogue gain is also controlled. For instance if the duty cycle is reduced from 90% to 45%, the output current will be reduced to 50%, i.e. 6 dB less gain. Because the noise adds in an r.m.s. fashion, the output current noise, and hence the output voltage noise component due to this current noise is reduced by 3 dB.

The pulse width required for the desired gain could be generated in a variety of ways. For instance if there is a high-speed data system clock available, the required pulse width can be defined by means of a counter. Alternatively a delay-locked loop (DLL) may be used to provide a series of delayed pulses, the appropriate edge or edges being selected to define one or both edges of the pulse PW.

Thus in this embodiment the DAC gain may be set proportionally to the required post-scaler gain $G_{ANA}$ by adjusting the value of the feedback resistance Rf by a first factor $G_{ANA1}$, and/or by adjusting the duty cycle by a second factor $G_{ANA2}$. Preferably, to give the desired range of gain both factors may be applied depending on the overall gain factor needed. Where both gain factors may be applied, since the noise benefit is greater from adjusting the value of the feedback resistance Rf than adjusting the duty cycle value PW, the feedback resistance is preferably reduced first to provide the maximum noise benefit. Thus the feedback resistance value may be reduced to its lowest value before the duty cycle is adjusted. Thus as illustrated in FIG. 14a the two gain factors may be adjusted as the total required gain is increased to increase $G_{ANA2}$ before $G_{ANA1}$.

Note that by ramping the PWM signal to zero, possibly with some dither or noise-shape modulation added to the control word, it may be possibly also to smoothly reduce the output to zero, i.e. to enable a smooth muting function by using the DAC modulation. Conversely for a smooth power-on it may be possible to ramp the PWM signal up from zero.

In some embodiments a third scaling factor $G_{ANA3}$ may be implemented by scaling the reference current. Halving the reference current will reduce the analogue signal (conversion) gain by 6 dB, and may give up to 3 dB noise improvement (more typically about 1.5 dB as discussed above) depending on the details of the circuitry. Again the various gain factors could be increased in order to minimise noise such as illustrated in FIG. 14b.

It should be noted that the use of PWM to make a conventional multi-bit DAC essentially a multiplying DAC (MDAC) represents a novel aspect of the invention.

It will of course be appreciated that the DAC may well have more than three current sources in practice. Also to desensitise to mismatch between current elements, there may be extra elements which are sequenced into circuit to average out the mismatch errors by well-known Dynamic Element Matching techniques. Other similar implementations may use a second switched current array to replace the bias current source IP shown, but preferably both arrays would receive a similar PW signal.

The embodiments of the invention described above may be used in a range of audio applications. In at least some of these applications an indication of the signal envelope and/or volume control signal may be usefully used to control other parameters of the an audio signal processing chain.

For instance in some amplifier circuits, for example in class G/H amplifiers, it is beneficial to adjust the supply voltage(s) provided to the amplifier based on an indication of the amplitude of the signal to be amplified and/or any volume setting applied. Embodiments of the present invention determine the signal envelope level and the overall gain applied to the analogue signal (based on a volume setting). Thus the envelope detector, and/or gain allocation module may be shared with a control unit for varying the magnitude of the supply voltage to at least a driver output stage, and possibly preceding stages of an audio amplifier circuit. In such embodiments it is clearly important that, in response to increases in signal level, the supply voltage to a stage is increased sufficiently in time for the increased signal level arriving at that stage. Thus the use of a pre-filter such as described above to emphasise increases in signal level is particularly useful for also controlling supply voltage variations.

FIG. 15 illustrates one example of part of an audio signal processing chain comprising a digital gain element 102, a DAC 101, and an output amplifier 1506. As described previously the amplifier 1506 may act as the analogue gain element or the DAC 101 may include an analogue gain element A controller 1501, which may include a gain setting module according to embodiments of the present invention, may receive an envelope signal ENV indicative of the envelope signal (for instance from a suitable envelope detector such as describe previously). The controller 1501 may determine appropriate gain control signals $G_{DIG}$ and $G_{ANA}$ as described previously and may also generate a supply voltage control signal, SV, to control the supply voltage delivered by variable voltage power supply 1502, such as a multi-mode charge pump for example as disclosed in U.S. Pat. No. 7,626,445 to the amplifier stage 1506.

It may additionally or alternatively be beneficial to alter the clock frequency applied to a charge pump or other DC-DC converter used to supply power to an amplifier stage according to anticipated load demand, e.g. to reduce switching losses at low load demands. Thus the controller 1502 may control clock generator 1503 to supply a clock signal CLK to power supply 1502 with an appropriate frequency.

In some applications the bias current(s) supplied to various elements, e.g. such as amplifiers and/or a DAC, in the signal processing chain, between $D_{IN}$ and $A_{OUT}$, based on an indication of the signal level or load demand. Thus controller 1501 may also control a bias generation 1504 for supplying bias to one or more elements, e.g. the DAC 101 and/or the amplifier 1506, in the signal processing chain.

In some applications with multiple amplifier stages it may be desirable to alter the number of stages of the amplifier used, for instance to optimise power and/or bandwidth with regard to load impedance.

As mentioned the envelope detector described herein may therefore be shared with other control circuitry arranged to implement any or all of these techniques. Additionally or alternatively the gain allocation unit may receive a control signal which determines the gain or attenuation applied to the analogue signal and also the digital gain or attenuation applied to the digital signal for at least part of the signal processing path from such other control circuitry and/or the gain allocation module could comprise part of a general controller. Thus the controller 1501 may receive a volume control signal VOL. In some instance however the indication of signal level may be determine upstream of the digital-to-analogue conversion signal path described herein, for instance in an mp3 decoder or the like. In some instance a parameter of the load such a detected load impedance may additionally or alternatively be used to control some elements of the signal processing path. The controller may therefore receive a control signal LOAD indicative of the load, not illustrated, driven by the amplifier 1506.

Digital-to-analogue conversion circuits such as described herein may be used in a range of different applications. In particular the conversion circuits may be used in audio amplifier circuits for generating audio signals for driving an audio transducer such as a headphone, headset or earphone, or an on-board transducer or a host device. Embodiments of the invention may be suitable for active noise cancellation circuits. may be arranged as part of an audio and/or signal processing circuit, for instance an audio circuit which may be provided in a host device. A digital-to-analogue conversion circuit according to an embodiment may be implemented as an integrated circuit and may be implemented in a host device, especially a portable and/or battery powered host device such as a mobile telephone, an audio player, a video player, a PDA, a mobile computing platform such as a laptop computer or tablet and/or a games device for example.

The skilled person will recognise that at least some aspects of the above-described apparatus and methods may be embodied as processor control code, for example on a carrier medium such as a disk, CD- or DVD-ROM, programmed memory such as read only memory (Firmware), or on a data carrier such as an optical or electrical signal carrier. For some applications embodiments of the invention will be implemented on a DSP (Digital Signal Processor), ASIC (Application Specific Integrated Circuit) or FPGA (Field Programmable Gate Array). Thus the code may comprise conventional programme code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Additionally the term "gain" does not exclude "attenuation" and vice-versa. Any reference numerals or labels in the claims shall not be construed so as to limit their scope.

The invention claimed is:

1. A digital to analog conversion circuit comprising:
a digital input for receiving an input digital audio signal;
an analog output for outputting an analog version of the input digital audio signal;
a digital-to-analog converter located in a signal path between the digital input and analog output and having a DAC input;
a digital variable gain element configured to apply a digital gain in a segment of said signal path between the digital input and the DAC input;
an analog variable gain element configured to apply an analog gain in a segment of said signal path between the DAC input and the analog output; and
a gain controller comprising:
a gain allocation module configured to control the allocation of gain between said digital and analog variable gain elements in response to changes in a signal level of the input digital audio signal;
wherein said gain allocation module is operable in first and second modes of operation wherein the response of the gain allocation module to reductions in said signal level of the input digital signal is slower in the first mode than in the second mode of operation; and
a low-level detector configured to monitor the input digital audio signal at the digital input so as to detect a low-level part of the signal;
wherein:
the gain controller is configured to change said gain allocation module from said first mode of operation to said second mode of operation following detection by said low-level detector of a low-level part of the input digital audio signal;
the segment of the signal path between said digital input and said digital variable gain element has a propagation delay that is equal to a first time period;
said gain controller has a propagation delay between arrival of a low-level part of the signal at the digital input and the corresponding change in operating mode of the gain allocation module that is equal to a second time period;
the first time period is greater than the second time period by an amount equal to a third time period; and
in the second mode of operation, the response of the gain allocation module to reductions in signal level is fast enough such that the minimum time taken to change from an initial digital gain allocation existing on the change to the second mode of operation to a target digital gain allocation appropriate for the low-level part of the signal is less than the third time period for substantially all possible initial digital gain allocations.

2. A digital to analog conversion circuit as claimed in claim 1 wherein in the first mode the response of the gain allocation module to reductions in signal level is such that the minimum time between a change in signal level being detected by the gain allocation module and a corresponding change in gain is greater than the third time period.

3. A digital-to-analog conversion circuit as claimed in claim 1 wherein the gain allocation module comprises an envelope detector for monitoring the envelope level of the digital input audio signal and the gain allocation module controls the digital gain allocation in response to said detected envelope level.

4. A digital-to-analog conversion circuit as claimed in claim 3 wherein said envelope detector monitors a delayed signal which is a version of the digital input audio signal which is delayed with respect to the digital input audio signal at the digital input by a first delay period; and
wherein the first delay period is greater than the propagation delay between arrival of a low-level part of the signal at the digital input and the corresponding change in operating mode of the gain allocation module.

5. A digital-to-analog conversion circuit as claimed in claim 4 wherein the envelope detector monitors said version of the digital input audio signal at a first point in the signal path downstream of the digital input, and wherein the signal path comprises at least one delay element between the digital input and the first point in the signal path downstream of the digital input.

6. A digital-to-analog conversion circuit as claimed in claim 5 wherein said at least one delay element comprises a filter.

7. A digital-to-analog conversion circuit as claimed in claim 4 wherein the envelope detector monitors said version of the digital input audio signal at a first point in the signal path downstream of the digital input, and wherein the signal path has a propagation delay between the digital input and the first point which is substantially equal to said first delay period.

8. A digital-to-analog conversion circuit as claimed in claim 4 wherein the gain allocation module comprises a delay element arranged to delay the signal input to the envelope detector.

9. A digital-to-analog conversion circuit as claimed in claim 3 wherein the envelope detector has a variable decay time constant and the decay time constant is reduced in said second mode compared to said first mode.

10. A digital-to-analog conversion circuit as claimed in claim 3 wherein the envelope detector has a variable hold time and the hold time is reduced in said second mode compared to said first mode.

11. A digital-to-analog conversion circuit as claimed in claim 3 wherein the response of the envelope detector to signal reductions is sufficiently fast for the second mode of operation, and wherein the gain allocation module comprises gain selection circuitry configured to, in said first mode of operation, limit the change in gain allocation in response to the detected envelope to provide the slower response of the gain allocation module.

12. A digital-to-analog conversion circuit as claimed in claim 11 wherein the output from the envelope detector is delayed before being received by said gain selection circuitry.

13. A digital-to-analog conversion circuit as claimed in claim 11 wherein said gain selection circuitry comprises a first gain calculation module for determining a first gain control signal based on said detected envelope and a second gain calculation module for, in said first mode, delaying or filtering said first gain control signal, and a third gain calculation module for determining the gain allocation based on the output of the second gain calculation module.

14. A digital-to-analog conversion circuit as claimed in claim 3 wherein the gain controller comprises a filter for filtering the signal from the signal path before envelope detection wherein said filter comprises a filter element for emphasising any rise in signal level.

15. A digital-to-analog conversion circuit as claimed in claim 1 wherein said low-level detector detects a low-level part of the signal if the digital signal is at or below a first threshold; and
wherein a low-level part of the signal is only detected if the digital signal remains below the first threshold for a predetermined period of time.

16. A digital-to-analog conversion circuit as claimed in claim 1 wherein the digital to analog converter comprises the analog variable gain element.

17. An electronic device comprising a digital-to-analog conversion circuit as claimed in claim 1;
wherein said electronic device is at least one of: a portable device; a battery powered device; a communications device; a computing device; a laptop computer, a tablet, a mobile telephone; a personal media player; a PDA; or a games device.

18. A digital-to-analog conversion circuit comprising:
an audio signal path for receiving a digital audio signal and outputting an analog audio signal;
a digital-to-analog converter disposed within said audio signal path;
digital variable gain circuitry disposed within said audio signal path;
analog variable gain circuitry disposed within said audio signal path;
a gain allocation module for controlling the allocation of the respective gains of the digital and analog gain circuitry in response to the digital audio signal the gain allocation module comprising an envelope detector for monitoring the envelope level of the digital audio signal and the gain allocation module controls the digital gain allocation in response to said detected envelope level, wherein the envelope detector has a variable decay time constant and the decay time constant is reduced in said second mode compared to said first mode; and
level detect circuitry for detecting the level of a digital audio signal at a first point along said signal path prior to said digital variable gain circuitry, wherein the level control circuitry controls the maximum rate of change of gain of the gain controller in response to detection of a low level part of said digital audio signal at said first point.

19. A digital-to-analog conversion circuit comprising:
a dynamic gain allocation controller for allocating gain inversely between digital input and analog output gain elements, the gain allocation module comprising an envelope detector for monitoring the envelope level of the digital audio signal and the gain allocation module controls the digital gain allocation in response to said detected envelope level, wherein:
the response of the envelope detector to signal reductions is sufficiently fast for the second mode of operation, and wherein the gain allocation module comprises gain selection circuitry configured to, in said first mode of operation, limit the change in gain allocation in response to the detected envelope to provide the slower response of the gain allocation module; and
said gain selection circuitry comprises a first gain calculation module for determining a first gain control signal based on said detected envelope and a second gain calculation module for, in said first mode, delaying or filtering said first gain control signal, and a third gain calculation module for determining the gain allocation based on the output of the second gain calculation module; and
a low-level detector circuit for detecting low-level portions of a received digital audio input signal;
said gain allocation controller being responsive to said low-level detector to switch into a fast-response mode on detection of said low-level portion.

* * * * *